(12) United States Patent
Hwang et al.

(10) Patent No.: US 10,412,349 B2
(45) Date of Patent: Sep. 10, 2019

(54) IMAGE SENSOR INCLUDING PHASE DETECTION PIXEL

(71) Applicant: Samsung Electronics Co., Ltd., Suwon-si (KR)

(72) Inventors: Min-ji Hwang, Seongnam-si (KR); Seung-jin Lee, Yongin-si (KR); Young-woo Lee, Seoul (KR); Seok-yong Hong, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/870,382

(22) Filed: Jan. 12, 2018

(65) Prior Publication Data

US 2018/0352199 A1    Dec. 6, 2018

(30) Foreign Application Priority Data

Jun. 5, 2017    (KR) .................. 10-2017-0069771

(51) Int. Cl.
    *H04N 9/04*    (2006.01)
    *H04N 9/077*   (2006.01)
    *H01L 27/146*  (2006.01)
    *H04N 5/369*   (2011.01)

(52) U.S. Cl.
    CPC ....... *H04N 9/045* (2013.01); *H01L 27/14605* (2013.01); *H01L 27/14621* (2013.01); *H01L 27/14623* (2013.01); *H01L 27/14627* (2013.01); *H01L 27/14636* (2013.01); *H01L 27/14641* (2013.01); *H01L 27/14645* (2013.01); *H04N 5/36961* (2018.08); *H04N 9/077* (2013.01)

(58) Field of Classification Search
    CPC .. H04N 9/045; H04N 9/077; H01L 27/14621; H01L 27/14636; H01L 27/14627; H01L 27/14645; H01L 27/14605; H01L 27/14623
    USPC .......................... 348/294–324; 257/290–292
    See application file for complete search history.

(56) References Cited

U.S. PATENT DOCUMENTS

| | | | |
|---|---|---|---|
| 6,781,632 B1* | 8/2004 | Ide .................. | G03B 13/00 250/201.2 |
| 7,652,713 B2* | 1/2010 | Yamasaki ............. | G02B 7/34 348/345 |
| 9,338,380 B2 | 5/2016 | Milnar | |
| 9,445,018 B2 | 9/2016 | Fettig et al. | |
| 9,455,285 B2 | 9/2016 | Keelan et al. | |
| 9,485,442 B1 | 11/2016 | Li et al. | |
| 2016/0118429 A1* | 4/2016 | Otsuji ............... | H01L 27/14623 250/206 |

(Continued)

*Primary Examiner* — Yogesh K Aggarwal
(74) *Attorney, Agent, or Firm* — Muir Patent Law, PLLC

(57) ABSTRACT

Provided is an image sensor including a pixel array which provides a plurality of pixels arranged in rows and columns. The plurality of pixels include: a plurality of image sensing pixels each including a plurality of image sensing sub pixels that include the same color filter; and a plurality of phase detection pixels each including at least one phase detection sub pixel which generates a phase signal for calculating a phase difference between images, wherein the plurality of image sensing sub pixels included in the same image sensing pixel are connected to one selection signal line and receive the same selection signal.

14 Claims, 21 Drawing Sheets

(56) References Cited

U.S. PATENT DOCUMENTS

2016/0255289 A1\* 9/2016 Johnson ................ H04N 5/355
 348/273
2017/0041525 A1 2/2017 Liu et al.

\* cited by examiner

FIG. 16B

IMAGE SENSOR INCLUDING PHASE DETECTION PIXEL

CROSS-REFERENCE TO RELATED APPLICATION

This application claims the benefit of priority under 35 U.S.C. § 119(e) to Korean Patent Application No. 10-2017-0069771, filed on Jun. 5, 2017, in the Korean Intellectual Property Office, the disclosure of which is incorporated herein in its entirety by reference.

BACKGROUND

The present disclosure relates to an image sensor, and more particularly, to an image sensor including a phase detection pixel.

Image sensors that capture images and convert them into electrical signals are used in cameras installed in automobiles, security devices, and robots, as well as in general consumer electronic devices such as digital cameras, mobile phone cameras, and portable camcorders. Each of such image sensors has a pixel array, and each pixel included in the pixel array may include an optical sensing element. In general, an image sensor may be required to perform an auto-focusing function so that image shooting can be performed quickly and accurately.

SUMMARY

The present disclosure provides an image sensor capable of ensuring image quality while quickly performing an auto-focusing function.

According to an aspect of the inventive concept, there is provided an image sensor including a pixel array which provides a plurality of pixels arranged in rows and columns, wherein the plurality of pixels include: a plurality of image sensing pixels each including a plurality of image sensing sub pixels that include the same color filter; and a plurality of phase detection pixels each including at least one phase detection sub pixel configured to generate a phase signal for calculating a phase difference between images, wherein the plurality of image sensing sub pixels included in the same image sensing pixel are connected to one selection signal line and receive the same selection signal.

According to another aspect of the inventive concept, there is provided an image sensor including a pixel array which provides a plurality of pixels arranged in rows and columns, wherein the plurality of pixels includes: a plurality of image sensing pixels each configured to generate an image signal; and a first phase detection pixel and a second phase detection pixel configured to generate different phase signals for calculating phase differences between images, wherein a ratio of the number of the first phase detection pixels and the number of the second phase detection pixels to the number of the plurality of pixels arranged in the pixel array has a value of ¹⁄₁₆ or ¹⁄₃₂.

According to another aspect of the inventive concept, there is provided an image sensor including: a pixel array including a plurality of phase detection pixels and a plurality of image sensing pixels; and a row driver configured to generate signals for controlling the pixel array, wherein each of the plurality of phase detection pixels includes at least one phase detection sub pixel, and each of the plurality of image sensing pixels includes a plurality of image sensing pixels connected to the row driver through one selection signal line and receive the same selection signal.

BRIEF DESCRIPTION OF THE DRAWINGS

Example embodiments of the inventive concept will be more clearly understood from the following detailed description taken in conjunction with the accompanying drawings in which:

FIGS. 6A to 6C are views for explaining arrangements of a plurality of shared pixels included in the pixel array of FIG. 3;

FIG. 9 is a view for explaining arrangements of a plurality of shared pixels included in the pixel array of FIG. 3;

FIG. 11 is a view for explaining arrangements of a plurality of shared pixels included in the pixel array of FIG. 3;

FIGS. 15A to 15C are views for explaining arrangements of a plurality of pixels included in a pixel array of FIG. 2; and FIGS. 16A and 16B are views for explaining arrangements of a plurality of pixels included in a pixel array of FIG. 2.

DETAILED DESCRIPTION OF THE EMBODIMENTS

Hereinafter, example embodiments of the inventive concept will be described in detail with reference to the accompanying drawings.

Figure 1:
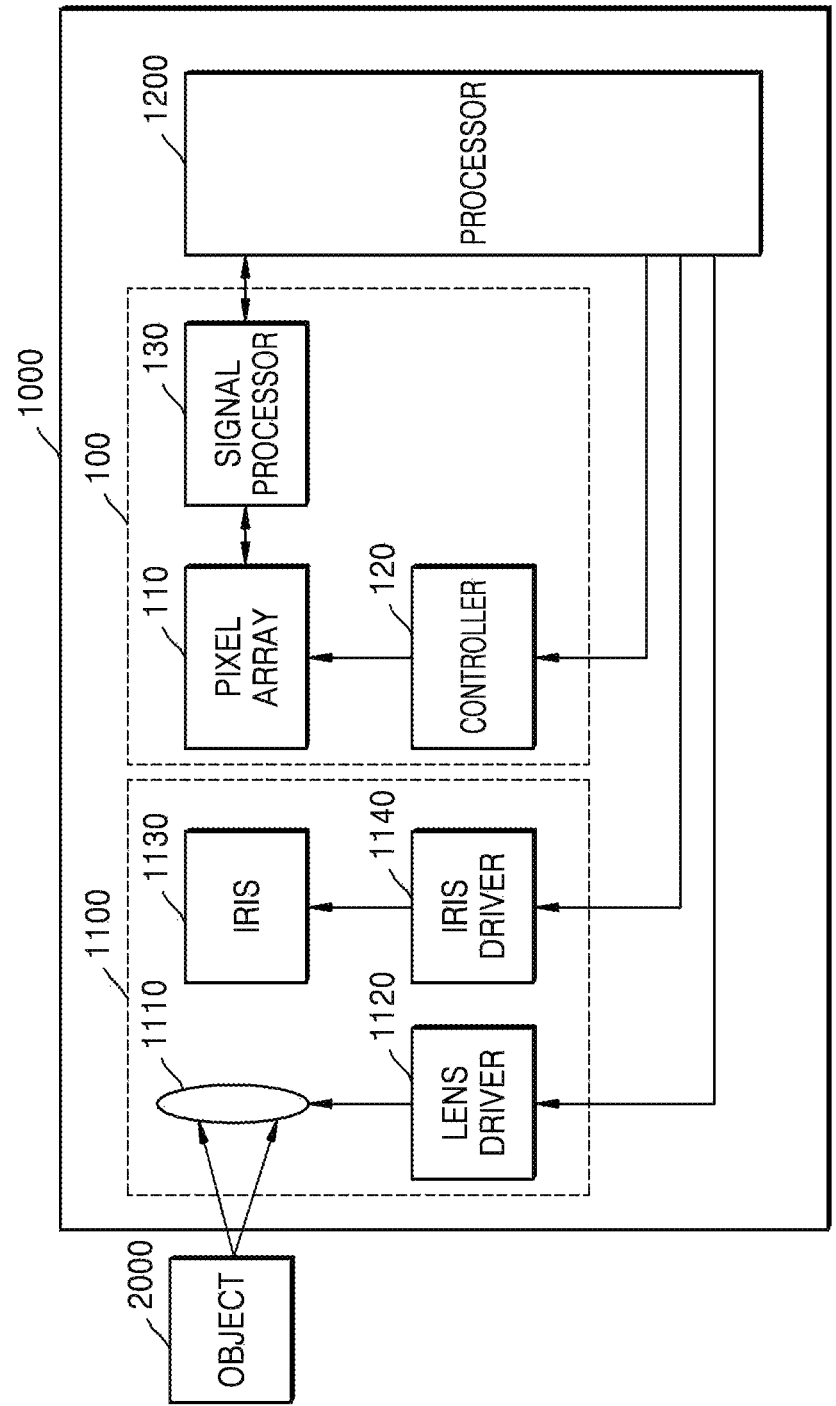
FIG. 1 is a view of an exemplary structure of a digital imaging device according to an example embodiment of the inventive concept.

FIG. 1 is a view of an exemplary structure of a digital imaging device 1000 performing an Auto-Focus (AF) function, according to an example embodiment of the inventive concept.

According to an example embodiment of the inventive concept, the digital imaging device 1000 may include a photographing unit 1100, an image sensor 100, and a processor 1200 (e.g., a central processing unit (CPU)). The digital imaging device 1000 may have a focus detection function.

All operations of the digital imaging device 1000 may be controlled by the processor 1200. The processor 1200 may provide a control signal for operation of each component to a lens driver 1120, an iris driver 1140, a controller 120, and the like.

The photographing unit 1100 may include a lens 1110, the lens driver 1120, an iris 1130, and the iris driver 1140 as components for receiving light. The lens 1110 may include a plurality of lenses.

The lens driver 1120 may adjust a position of the lens 1110 according to the control signal provided by the processor 1200. The lens driver 1120 may move the lens 1110 in a direction in which a distance of the lens 1110 from an object 2000 increases or decreases. Thereby, the distance between the lens 1110 and the object 2000 may be adjusted. Depending on the position of the lens 1110, the object 2000 may be focused or defocused.

For example, if the distance between the lens 1110 and the object 2000 is relatively short, the lens 1110 may be out of an in-focus position to focus on the object 2000, and phase differences may be generated between images captured by the image sensor 100. The lens driver 1120 may move the lens 1110 in the direction in which the distance of the lens 1110 from the object 2000 increases, based on the control signal provided by the processor 1200.

Alternatively, if the distance between the lens 1110 and the object 2000 is relatively long, the lens 1110 may be out of the in-focus position, and phase differences may be generated between images formed on the image sensor 100. The lens driver 1120 may move the lens 1110 in the direction in which the distance of the lens 1110 from the object 2000 decreases, based on the control signal provided by the processor 1200.

The image sensor 100 may convert an incident light into an image signal. The image sensor 100 may include the pixel array 110, the controller 120, and a signal processor 130. An optical signal transmitted through the lens 1110 and the iris 1130 reaches a light-receiving surface of the pixel array 110 and may form an image of a subject thereon.

The pixel array 110 may be a Complementary metal oxide semiconductor Image Sensor (CIS) that converts the optical signal into an electrical signal. Sensitivity and the like of the pixel array 110 may be adjusted by the controller 120. The pixel array 110 may include a plurality of pixels PX including a plurality of image sensing pixels IPX and a plurality of phase detection pixels PPX.

In some embodiments, the plurality of phase detection pixels PPX may be arranged in the pixel array 110 of a tetra-cell structure, e.g., a structure implemented using shared pixels including a plurality of sub pixels to provide a wide dynamic range and a phase difference AF function. The term "shared pixels" as used in this disclosure may refer to a plurality of pixel groups that are arranged to share certain circuitry. For example, a pixel group may include a plurality of sub pixels and at least some of the sub pixels in the pixel group may share at least one of a reset transistor, a source follower transistor, and selecting transistor. In this implementation, each pixel group may include four sub pixels and four photodiodes corresponding to each sub pixel, but the disclosure is not limited thereto. The reset transistor may be activated to reset the floating charge accumulated by the photodiodes connecting the photodiodes to a power supply Vdd removing all integrated charge from the previous exposure period. Source follower transistor may provide an analog pixel signal to column signal line corresponding to the charge accumulated by a selected photodiode. Select transistor may operate to connect the analog pixel signal provided by the source follower transistor to the corresponding column signal line. In this example, each pixel group may have transfer transistors, the reset transistor, the source follower transistor and the selecting transistor that are not shared with other pixel groups. For example, a plurality of image sensing sub pixels included in the same shared image sensing pixel IPX may be connected to one selection signal line and may receive the same selection signal. In some embodiments, the plurality of phase detection pixels PPX may be arranged in the pixel array 110 at an appropriate ratio so that the image sensor 100 may provide an efficient compensation function and a phase difference AF function while maintaining a high resolution. For example, a ratio of the number of phase detection sub pixels arranged in the pixel array 110 to the number of the plurality of shared pixels arranged in the pixel array may be 1/32 in one embodiment or 1/64 in another embodiment. This will be described in detail later below with reference to FIG. 2 and the like.

The processor 1200 may receive pixel information from the signal processor 130 to perform a phase difference calculation. A plurality of phase detection pixels PPX included in the pixel array 110 may be used to focus on an object. The plurality of phase detection pixels PPX may generate phase signals. The phase signals may include information associated with positions of images formed on the image sensor 100. Accordingly, the phase signals may be used to calculate phase differences between images. The in-focus position of the lens 1110 may be calculated based on the calculated phase differences. For example, a position of the lens 1110 where a phase difference is 0 may be the in-focus position. The processor 1200 may obtain a position of a focus, a direction of the focus, or a distance between the object 2000 and the image sensor 100 as a result of the phase difference calculation. The processor 1200 may output a control signal to the lens driver 1120 to move the position of the lens 1110 based on the result of the phase difference calculation.

The processor 1200 may reduce noise of an input signal and may perform image signal processing for improving image quality such as a gamma correction, color filter array interpolation, a color matrix, a color correction, color enhancement, and the like. In addition, the processor 1200 may compress image data generated by the image signal processing for improving image quality to generate an image file, or may restore the image data from the image file.

Figure 2:
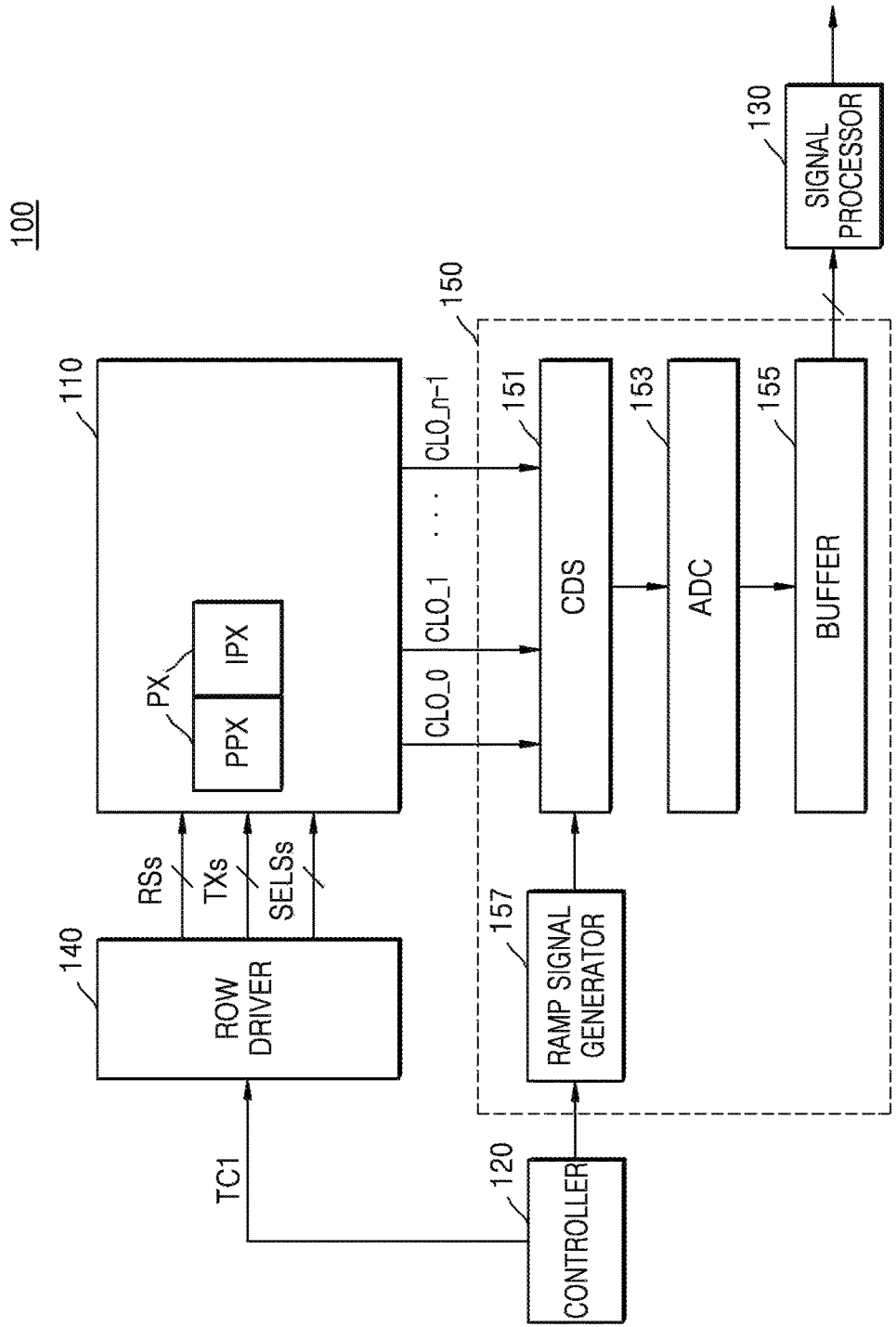
FIG. 2 is a block diagram of a configuration of an image sensor according to an example embodiment of the inventive concept.

FIG. 2 is a block diagram of a configuration of the image sensor 100 according to an exemplary embodiment of the inventive concept.

As illustrated in FIG. 2, the image sensor 100 may include the pixel array 110, the controller 120, the signal processor 130, a row driver 140, and a signal reader 150.

The pixel array 110 may be formed in pixel units and may include a plurality of pixels PX. Each of the plurality of pixels PX may include a corresponding optical sensing element. For example, the optical sensing element may be a photodiode. The plurality of pixels PX absorb light to generate electric charges, and an electric signal (output voltage) according to the generated electric charge may be provided to the signal reader 150.

The pixel array 110 may include a plurality of image sensing pixels IPX and a plurality of phase detection pixels PPX. The plurality of image sensing pixels IPX may generate image signals corresponding to an object. The plurality of phase detection pixels PPX may generate phase signals used for calculating phase differences between images. A plurality of image sensing pixels and a plurality of phase detection pixels may be arranged in pixel units PX.

The plurality of phase detection pixels PPX included in the image sensor 100 may be used for focusing on an object. The phase signals generated by the plurality of phase detection pixels PPX may include information about positions of the images formed on the image sensor 100. Thus, the phase signals may be used for calculating the phase differences between the images. Based on the calculated phase differences, an in-focus position of the lens 1110 (FIG. 1) may be calculated. For example, a position of the lens 1110 (FIG. 1) that makes a phase difference zero may be the in-focus position.

In an example embodiment of the inventive concept, the plurality of phase detection pixels PPX may be used for measuring the distance between the object 2000 and the image sensor 100 as well as focusing on the object 2000. Additional information such as phase differences between images formed on the image sensor 100, a distance between the lens 1110 and the image sensor 100, a size of the lens 1110, an in-focus position of the lens 1110, etc. may be referred to measure the distance between the object 2000 and the image sensor 100.

The controller 120 may control the row driver 140 so that the pixel array 110 may accumulate electric charges by absorbing light, store the accumulated electric charges temporarily, and output electric signals corresponding to the stored electric charges to the outside of the pixel array 110. In addition, the controller 120 may control the signal reader 150 to measure an output voltage provided by the pixel array 110.

The row driver 140 may generate reset control signals RSs, transmission control signals TXs, and selection signals SELSs for controlling the pixel array 110 and provide the generated signals RSs, TXs, and SELSs to the plurality of pixels PX included in the pixel array 110. The row driver 140 may determine activation and deactivation timings of reset control signals RSs, transmission control signals TXs, and selection signals SELSs for the plurality of phase detection pixels PPX, based on whether or not to perform an AF function.

The signal reader 150 may include a correlated double sampler (CDS) 151, an analog-to-digital converter (ADC) 153, and a buffer 155. The CDS 151 may sample and hold the output voltage provided by the pixel array 110. The CDS 151 may double-sample a specific noise level and the provided output voltage, and may output a value corresponding to the difference between the specific noise level and the provided output voltage. For example, the CDS 151 may measure the output voltage provided by the pixel array 110 twice and subtract the first measured output voltage from the second measured output voltage to remove reset sampling noise. Generally, the sampling is performed once immediately following reset (e.g., the first measured output voltage) of a photodiode corresponding to a pixel of the plurality of pixels PX and once after the photodiode has been allowed to accumulate a charge (e.g., the second measured output voltage). The CDS 151 then subtracts the first measured output voltage from the second measured output voltage to remove reset sampling noise. Furthermore, the CDS 151 may receive a ramp signal generated by a ramp signal generator 157, compare the received ramp signals with each other, and output the comparison result. The ADC 153 may convert an analog signal corresponding to the level received from the CDS 151 into a digital signal. The buffer 155 may latch the digital signal and the latched signal may be sequentially output to the outside of the signal processor 130 or the image sensor 100.

The signal processor 130 may perform signal processing on data of the plurality of pixels PX to be received. The signal processor 130 may perform noise reduction processing, gain adjustment, waveform shaping processing, interpolation processing, white-balance processing, gamma processing, edge enhancement processing, and the like. In addition, the signal processor 130 may output information about the plurality of pixels PX to the processor 1200 at the time of phase difference AF to perform a phase difference calculation.

In one example embodiment, the signal processor 130 may be provided in the processor 1200 (FIG. 1) outside the image sensor 100.

Figure 3:
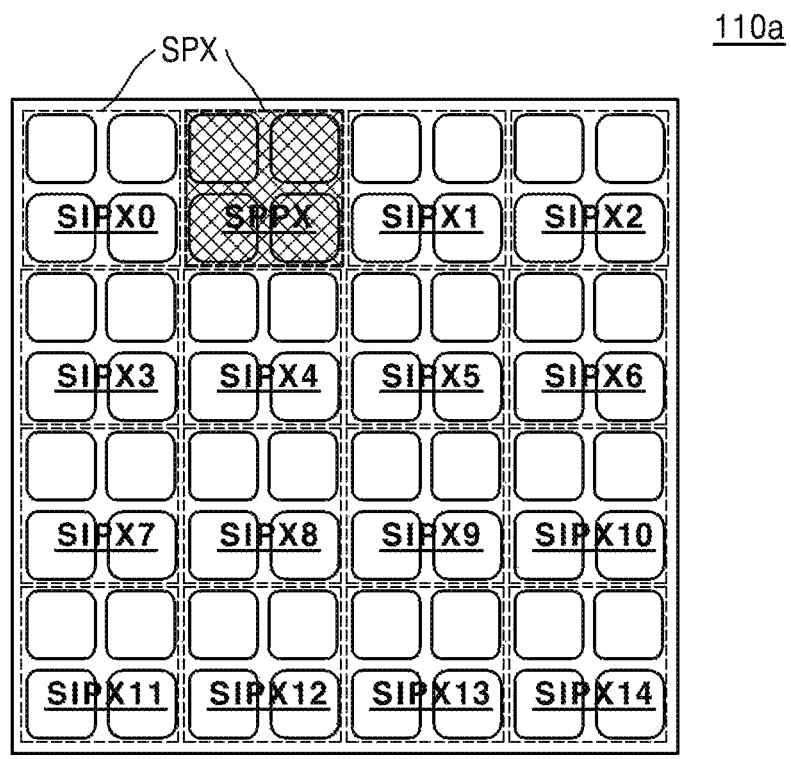
FIG. 3 is a view of an example embodiment of a pixel array of FIG. 2, and a pixel array of FIG. 3 shows a portion of a pixel array of FIG. 2.

FIG. 3 is a view of an example embodiment of the pixel array 110 of FIG. 2. A pixel array 110a of FIG. 3 shows a portion of the pixel array 110 of FIG. 2.

Referring to FIGS. 2 and 3, the pixel array 110a may include the plurality of pixels PX arranged according to a plurality of rows and a plurality of columns. For example, each shared pixel SPX defined as a unit including pixels arranged in two rows and two columns may include four sub pixels. The sub pixels may be one of the plurality of pixels PX. However, the present disclosure is not limited thereto, and each of the shared pixels SPX may include nine photodiodes respectively corresponding to nine pixels, or may include 16 photodiodes respectively corresponding to 16 pixels.

The pixel array 110a may include the plurality of shared pixels SPX including a plurality of shared image sensing pixels SIPX0 to SIPX14 and a shared phase detection pixel SPPX. The plurality of shared image sensing pixels SIPX0 to SIPX14 may include a plurality of image sensing sub pixels IPX and the shared phase detection pixel SPPX may include at least one phase detection sub pixel PPX. The phase detection sub pixel PPX may be a pixel for phase difference detection AF, and the plurality of image sensing sub pixels IPX may be general pixels capable of obtaining only image information. A plurality of sub pixels included in one shared pixel SPX may be connected to one selection signal line and may receive the same selection signal SELSs.

Each of the plurality of shared pixels SPX of the pixel array 110a may output a pixel signal to the CDS 151 through one of the first to $(n-1)^{th}$ column output lines CLO_0 to CLO_n-1. For example, the first shared image sensing pixel SIPX0 may be connected to the first column output line CLO_0 to provide a pixel signal to the CDS 151, and the shared phase detection pixel SPPX may be connected to the second column output line CLO_1 to provide a pixel signal to the CDS 151.

Each of the plurality of shared image sensing pixels SIPX0 to SIPX14 may include a color filter to sense various colors. In an example embodiment, the color filter includes filters that sense red, green, and blue, and each of the shared image sensing pixels SIPX0 to SIPX14 may include pixels in which the same color filter is disposed.

For example, each of the first shared image sensing pixel SIPX0, the second shared image sensing pixel SIPX1, the eighth shared image sensing pixel SIPX7, and the tenth shared image sensing pixel SIPX9 may include pixels having a red color filter, and each of the third shared image sensing pixel SIPX2, the fourth shared image sensing pixel SIPX3, the sixth shared image sensing pixel SIPX5, the ninth shared image sensing pixel SIPX8, the 11th sensing shared pixel SIPX10, the 12th shared image sensing pixel SIPX11, and the 14th shared image sensing pixel SIPX13 may include pixels having a green color filter, and each of the fifth shared image sensing pixel SIPX4, the seventh shared image sensing pixel SIPX6, the 13th shared image sensing pixel SIPX12, and the 15th shared image sensing pixel SIPX14 may include pixels having a blue color filter. As illustrated in the exemplary embodiment of FIG. 3, one shared phase detection pixel SPPX, configured to perform a phase difference AF function, is arranged at a position between the first shared image sensing pixel SIPX0 and the second shared image sensing pixel SIPX1 in a row direction and above the fifth shared image sensing pixel SIPX4 in a column direction, but the disclosure is not limited thereto. The shared phase detection pixel SPPX may be arranged at other positions of the pixel array 100a for performing a phase difference AF function.

However, the present disclosure is not limited thereto. The plurality of shared image sensing pixels SIPX0 to SIPX14 according to an example embodiment of the inventive concept may include various types of color filters. For example, the color filters may include filters for sensing yellow, cyan, magenta, and green colors. Alternatively, the color filters may include filters for sensing red, green, blue, and white colors. Also, the pixel array 110a may include more shared pixels, and arrangements of the shared image sensing pixels SIPX0 to SIPX14 may be variously implemented, and thus it is apparent that the present disclosure is not limited to FIG. 3.

The shared phase detection pixel SPPX may include a filter for sensing green color. However, the present disclosure is not limited thereto, and the phase detection sub pixel PPX included in the shared phase detection pixel SPPX may include filters for sensing white color.

Although only one shared phase detection pixel SPPX is shown in FIG. 3, the present disclosure is not limited thereto. Configuration and arrangement of the shared phase detection pixel SPPX will be described in detail later below with reference to FIG. 4A and the like.

An image sensor including the pixel array 110a according to the present disclosure may be controlled to detect light using a plurality of optical sensing elements included in the plurality of shared image sensing pixels SIPX0 to SIPX14 in a low-resolution operation mode to generate a pixel signal, so that a wide dynamic range may be secured even under a low illuminance condition. Also, in a high-resolution operation mode, it is possible to individually control optical sensing elements corresponding to each sub pixel included in the plurality of shared image sensing pixels SIPX0 to SIPX14 in order to generate pixel signals in units of sub pixels included in the plurality of shared image sensing pixels SIPX0 to SIPX14. Thereby, a wide dynamic range may be ensured simultaneously without being restricted by structures of the shared pixels. In addition, the image sensor including the pixel array 110a according to the present disclosure further include the shared phase detection pixel SPPX, so that the image sensor may perform a phase difference AF function.

Figure 4A:
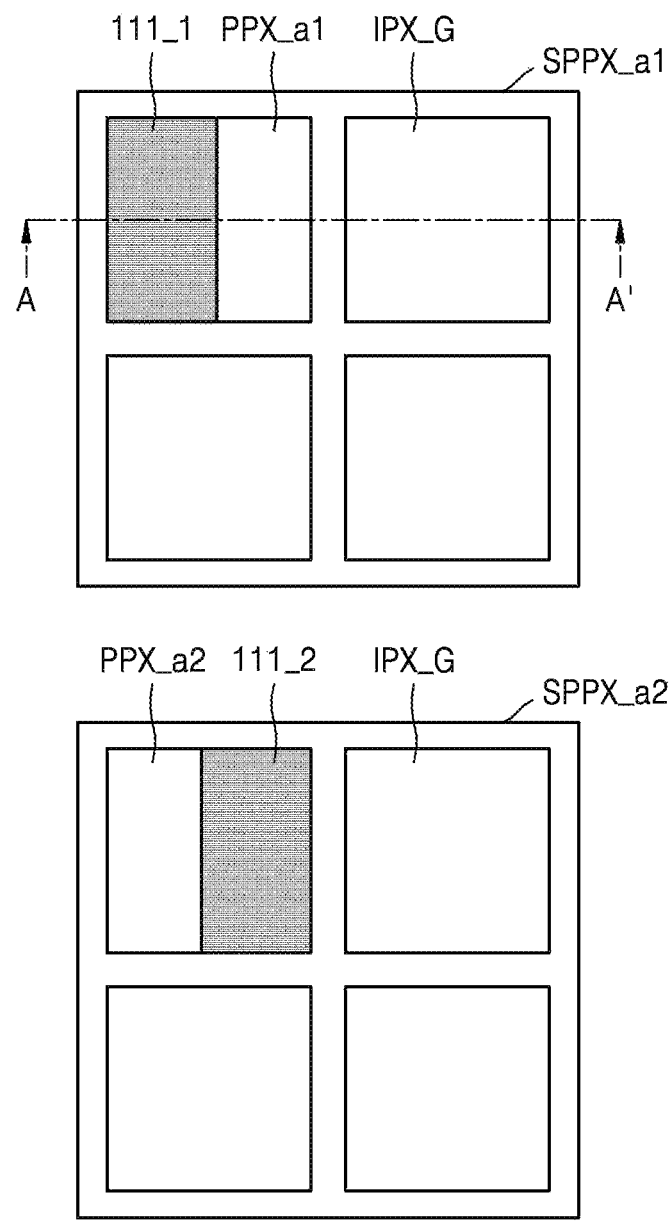
FIGS. 4A and 4B are views for explaining an example embodiment of a shared phase detection pixel of FIG. 3.
Figure 4B:
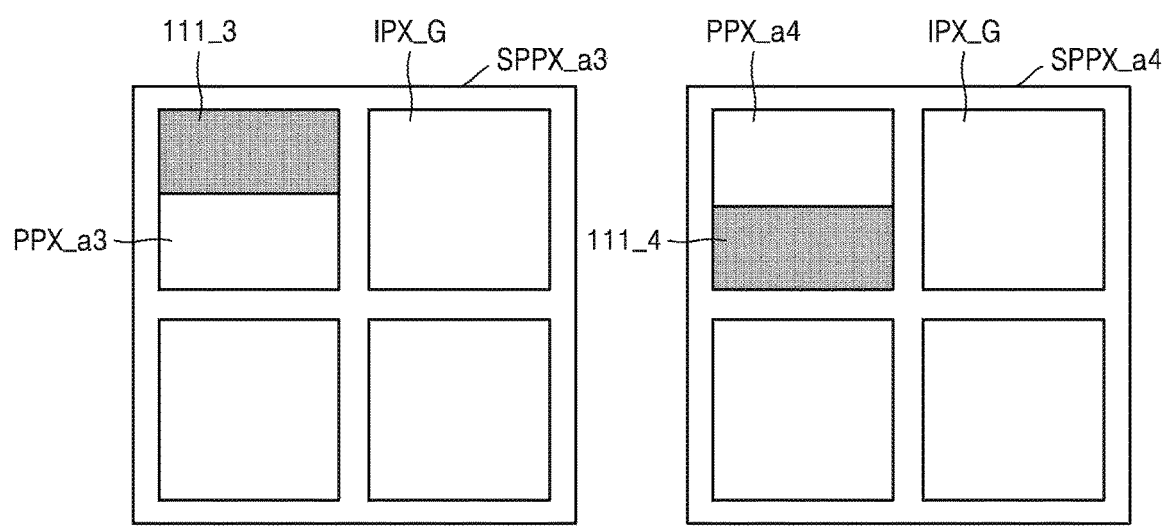
Figure 5:
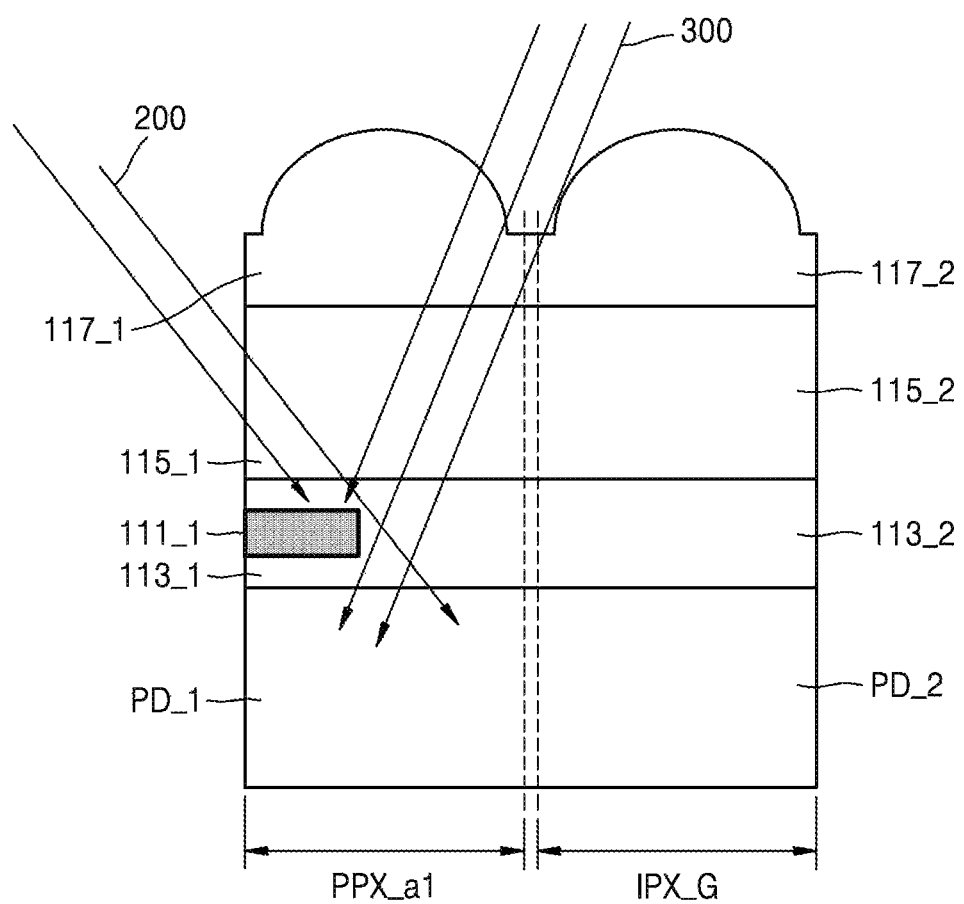
FIG. 5 is a cross-sectional view of a first shared phase detection pixel of FIG. 4A, taken along a line A-A'.

FIGS. 4A and 4B are views for explaining an example embodiment of the shared phase detection pixel SPPX of FIG. 3. FIG. 5 is a cross-sectional view of the first shared phase detection pixel SPPX_a1 of FIG. 4A, taken along a line A-A'.

Referring to FIGS. 3 and 4A, the shared phase detection pixel SPPX of FIG. 3 may be a first shared phase detection pixel SPPX_a1 or a second shared phase detection pixel SPPX_a2. The first shared phase detection pixel SPPX_a1 and the second shared phase detection pixel SPPX_a2 may include phase detection sub pixels PPX_a1 and PPX_a2 respectively, and may further include a plurality of remaining image sensing sub pixels IPX_G except for phase detection sub pixels.

According to an exemplary embodiment illustrated in FIG. 4A, the first phase detection sub pixel PPX_a1 is disposed at a top left of the first shared phase detection pixel SPPX_a1 and the second phase detection sub pixel PPX_a2 is disposed at a top left of the second shared phase detection pixel SPPX_a2. However, the present disclosure is not limited thereto. The first phase detection sub pixel PPX_a1 and the second phase detection sub pixel PPX_a2 may be disposed at the same position in the first shared phase detection pixel SPPX_a1 and the second shared phase detection pixel SPPX_a2, respectively.

In an example embodiment, the plurality of image sensing sub pixels IPX_G may include a green color filter, and each of the phase detection sub pixels PPX_a1 and PPX_a2 may also include a green color filter. In another example embodiment, each of the phase detection sub pixels PPX_a1 and PPX_a2 may include a white color filter.

The first phase detection sub pixel PPX_a1 may include a first light-shielding layer 111_1 and the second phase detection sub pixel PPX_a2 may include a second light-shielding layer 111_2. The first light-shielding layer 111_1 may be formed in a left-half portion of the first phase detection sub pixel PPX_a1 when the first phase detection sub pixel PPX_a1 is divided to cross a column direction, and the second light-shielding layer 111_2 may be formed in a right-half portion of the second phase detection sub pixel PPX_a2 when the second phase detection sub pixel PPX_a2 is divided to cross a column direction. Arrangements of the first shared phase detection pixel SPPX_a1 and the second shared phase detection pixel SPPX_a2 of a pixel array according to the present disclosure will be described in detail later below with reference to FIGS. 6A and 6B.

Referring to FIGS. 3 and 4A, the shared phase detection pixels SPPX of FIG. 3 may be the first shared phase detection pixel SPPX_a1 or the second shared phase detection pixel SPPX_a2. Third and fourth shared phase detection pixels SPPX_a3 and SPPX_a4 may include phase detection sub pixels PPX_a3 and PPX_a4, respectively, and may further include a plurality of remaining image sensing sub pixels IPX_G except for the phase detection sub pixels. The third and fourth phase detection sub pixels PPX_a3 and PPX_a4 may be disposed at the same position in the third and fourth shared phase detection pixels SPPX_a1 and SPPX_a2, respectively.

In an example embodiment, the plurality of image sensing sub pixels IPX_G may include a green color filter, and each of the phase detection sub pixels PPX_a3 and PPX_a4 may also include a green color filter. However, the present disclosure is not limited thereto. In another example embodiment, each of the phase detection sub pixels PPX_a3 and PPX_a4 may include a white color filter.

The third phase detection sub pixel PPX_a3 of the third shared phase detection pixel SPPX_a3 may include a third light-shielding layer 111_3 and the fourth phase detection sub pixel PPX_a4 of the fourth shared phase detection pixel SPPX_a4 may include a fourth light-shielding layer 111_4. The third light-shielding layer 111_3 may be formed in an upper portion of the third phase detection sub pixel PPX_a3 when the third phase detection sub pixel PPX_a3 is divided to cross a row direction, and the fourth light-shielding layer 111_4 may be formed in a lower portion of the fourth phase detection sub pixel PPX_a4 when the fourth phase detection sub pixel PPX_a4 is divided to cross a row direction. Arrangements of the third and fourth shared phase detection pixels SPPX_a3 and SPPX_a4 of a pixel array according to the present disclosure will be described in detail later below with reference to FIG. 6C.

Referring to FIGS. 4A and 5, the first phase detection sub pixel PPX_a1 may include an optical sensing element PD_1, the first light-shielding layer 111_1, an insulating layer 113_1, a color filter layer 115_1, and a micro lens 117_1. The first light-shielding layer 111_1 may be formed on the insulating layer 113_1 and may include a metal material. The plurality of image sensing sub pixels IPX_G includes an optical sensing element PD_2, an insulating layer 113_2, a green color filter layer 115_2, and a micro lens 117_2, but does not include a light-shielding layer.

Because of the first light-shielding layer 111_1, the optical sensing element PD_1 may not receive a part of light incident on the first shared phase detection pixel SPPX_a1. There may be a difference in the amount of light when a light 200 from the left side of the first light-shielding layer 111_1 is received by the optical sensing element PD_1 and a light 300 from the right side of the first light-shielding layer 111_1 is received by the optical sensing element PD_1. Accordingly, in a phase detection method used in an image sensor of the present disclosure, it is possible to determine whether an image sensor is in-focus based on a difference in the amount of light received by the first phase detection sub pixel PPX_a1 and the second phase detection sub pixel PPX_a2, by using the first and second phase detection sub pixels PPX_a1 and PPX_a2 in which light-shielding layers are disposed at different positions. Furthermore, it is also possible to calculate the direction and distance the lens 1110 (of FIG. 1) needs to be moved in order to be in-focus. By using the first and second phase detection sub pixels PPX_a1 and PPX_a2, it can be determined whether or not the lens 1110 is in-focus in a horizontal direction.

The description may be applied to the third and fourth phase detection sub pixels PPX_a3 and PPX_a4 of FIG. 4B, and it can be determined whether or not the lens 1110 is in-focus in a vertical direction by using the third and fourth phase detection sub pixels PPX_a3 and PPX_a4.

Figure 6A:
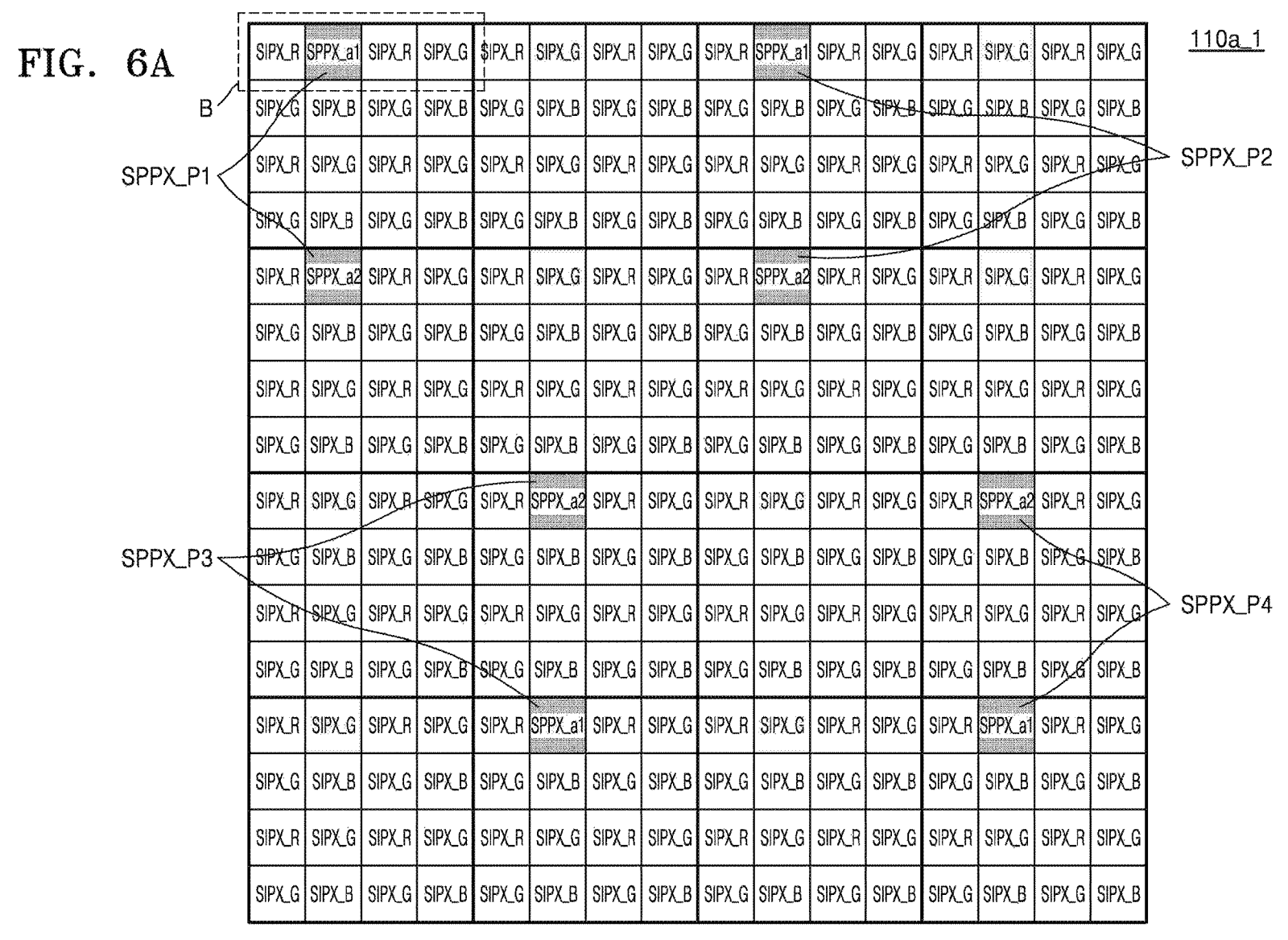
Figure 6B:
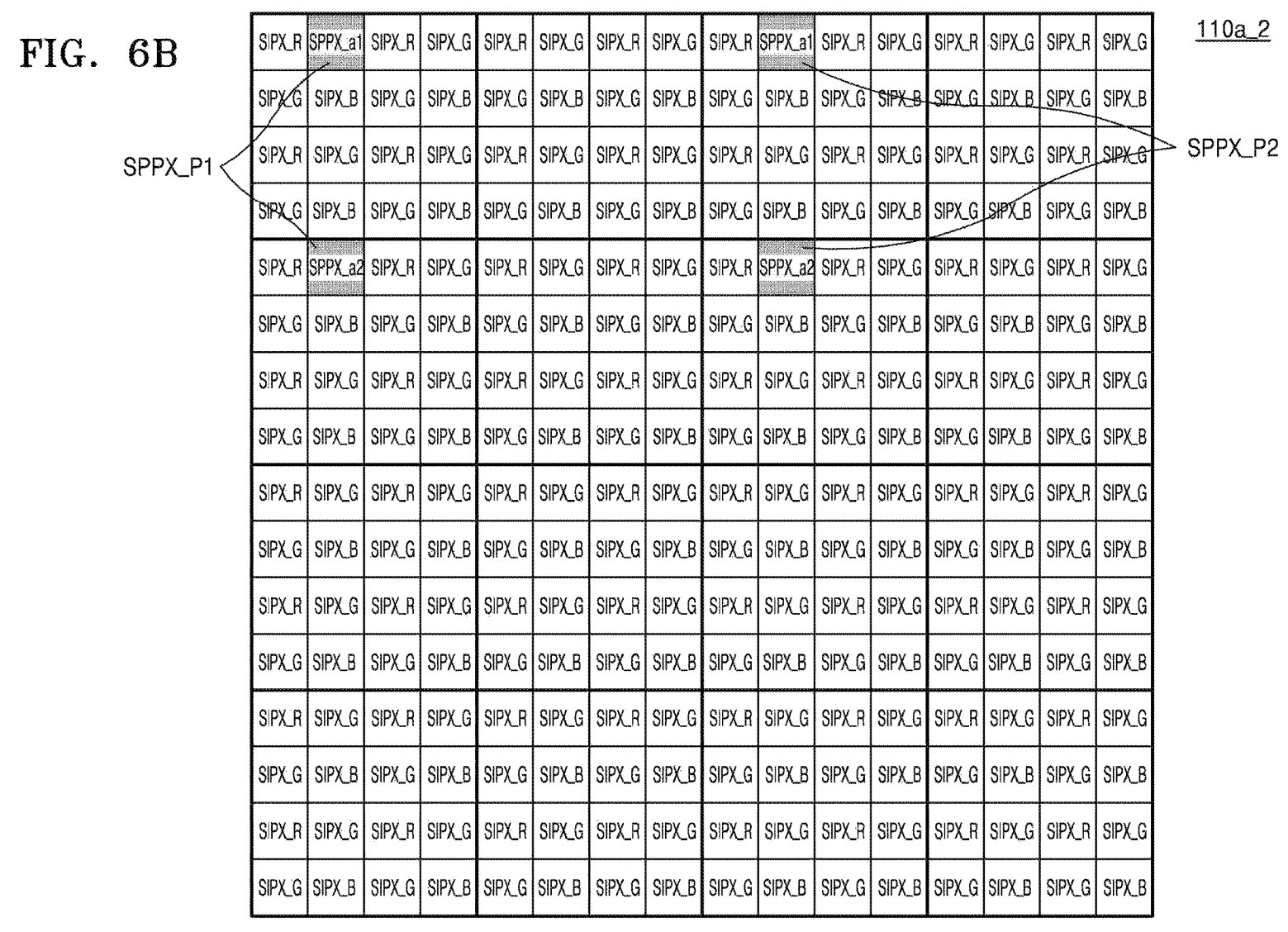
Figure 6C:
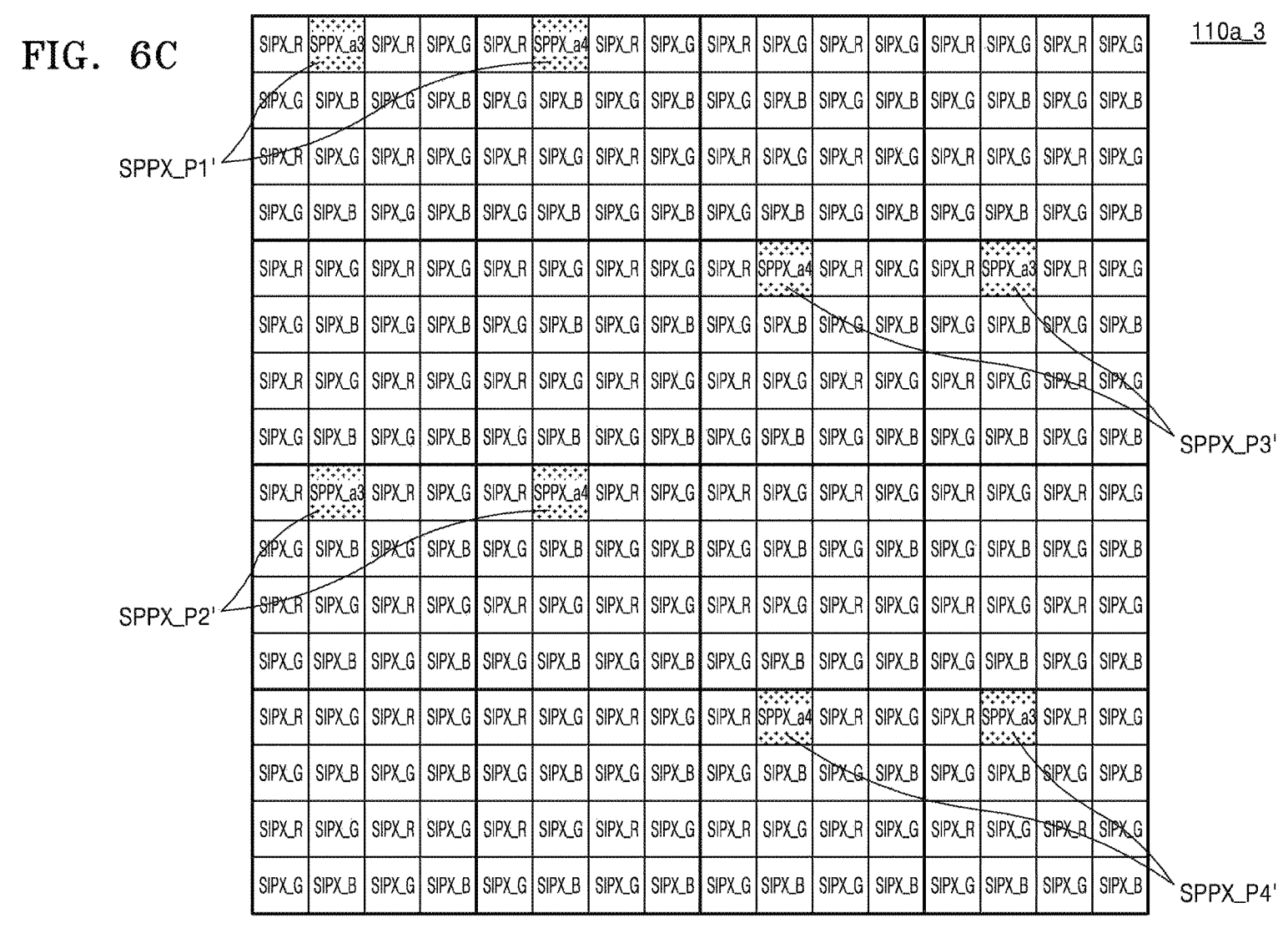

FIGS. 6A to 6C are views for explaining arrangements of a plurality of shared pixels included in the pixel array of FIG. 3. FIGS. 6A and 6B illustrate pixel arrays 110a_1 and 110a_2 including the first and second shared phase detection pixels SPPX_a1 and SPPX_a2 of FIG. 4A, and FIG. 6C illustrates a pixel array 110a_3 including the third and fourth shared phase detection pixels SPPX_a3 and SPPX_a4 of FIG. 4B.

Referring to FIG. 6A, the pixel array 110a_1 may include a plurality of shared image sensing pixels SIPX_R, SIPX_G, and SIPX_B, first shared phase detection pixels SPPX_a1, and second shared phase detection pixels SPPX_a2. The plurality of shared image sensing pixels SIPX_R, SIPX_G, and SIPX_B may include the plurality of shared image sensing pixels SIPX_R including a red color filter, the plurality of shared image sensing pixels SIPX_G including a green color filter, and the plurality of shared image sensing pixels SIPX_B including a blue color filter.

Each of the first and second shared phase detection pixels SPPX_a1 and SPPX_a2 may be arranged in pairs in the pixel array 110a_1. Therefore, the number of the first shared phase detection pixels SPPX_a1 and the number of the second shared phase detection pixels SPPX_a2 disposed in the pixel array 110a_1 may be the same. Each of the first shared phase detection pixel SPPX_a1 and the second shared phase detection pixel SPPX_a2 as a pair may include a plurality of groups SPPX_P1 to SPPX_P4.

Three shared image sensing pixels may be arranged in a column direction between the first shared phase detection pixel SPPX_a1 and the second shared phase detection pixel SPPX_a2 each constituting the plurality of groups SPPX_P1 to SPPX_P4. The pair of the first and second shared phase detection pixels SPPX_a1 and SPPX_a2 may be arranged in the same column and connected to the same column output line.

When the first and second shared phase detection pixels SPPX_a1 and SPPX_a2 as a pair are disposed at a distance from each other, the amount of light incident on the first shared phase detection pixel SPPX_a1 and the amount of light incident on the second shared phase detection pixel SPPX_a2 are different from each other irrespective of the presence or absence of a light shielding layer. Therefore, it may be inaccurate to calculate whether or not the lens 1110 (of FIG. 1) is in-focus and accordingly to calculate a moving direction and a moving distance of the lens 1110.

Meanwhile, when the first and second shared phase detection pixels SPPX_a1 and SPPX_a2 are adjacent to each other, it may be difficult to compensate the plurality of shared image sensing pixels SIPX_R, SIPX_G, and SIPX_B disposed around the first and second shared phase detection pixels SPPX_a1 and SPPX_a2. Since the compensation is performed using data of pixels adjacent to a corresponding pixel, a compensation operation of a shared image sensing pixel adjacent to both the first and second shared phase detection pixels SPPX_a1 and SPPX_a2 may become inaccurate. Therefore, when three shared image sensing pixels are disposed between the first and second shared phase detection pixels SPPX_a1 and SPPX_a2, a focus detection operation and a compensation operation may be efficiently performed.

A ratio of the number of the first shared phase detection pixels SPPX_a1 and the second shared phase detection pixels SPPX_a2 to the number of a plurality of shared pixels arranged in the pixel array 110a_1 may have a value of ⅟32. For example, in the pixel array 110a_1, four of the first shared phase detection pixels SPPX_a1 and four of the second phase detection pixels SPPX_a2 may be arranged when a plurality of shared pixels are arranged in 16 in a row direction and in 16 in a column direction (16>16), and a total of eight phase detection sub pixels may be arranged. When comparing the first group SPPX_P1 with the third group SPPX_P3, the first and second shared phase detection pixels SPPX_a1 and SPPX_a2 as a pair may be arranged to be the reverse of that shown in FIG. 6A.

In an example embodiment, the first group SPPX_P1 and the second group SPPX_P2 may be arranged in the same row and spaced apart from each other by seven shared image sensing pixels in a row direction. The first group SPPX_P1 and the third group SPPX_P3 may be arranged apart from each other by three shared image sensing pixels in a column direction and by three shared image sensing pixels in a row direction. However, the present disclosure is not limited thereto. In another example embodiment, the first group SPPX_P1 and the third group SPPX_P3 may be arranged in the same column, and may be arranged apart from each other by three shared image sensing pixels in a column direction. Thus, in the pixel array 110a_1 according to an example embodiment of the present disclosure, phase detection sub pixels may be arranged to meet the ratio of ⅟32 and arrangements of the first shared phase detection pixels SPPX_a1 and the second shared phase detection pixels SPPX_a2 including the phase detection sub pixels may differ from those shown in FIG. 6A.

Referring to FIG. 6B, a ratio of the number of the first shared phase detection pixels SPPX_a1 and the second shared phase detection pixels SPPX_a2 to the number of a plurality of shared pixels arranged in the pixel array 110a_2 may have a value of 1/64. For example, in the pixel array 110a_2, two of the first shared phase detection pixels SPPX_a1 and two of the second phase detection pixels SPPX_a2 may be arranged when a plurality of shared pixels are arranged in 16 in a row direction and in 16 in a column direction (16×16), and a total of four phase detection sub pixels may be arranged.

In an example embodiment, the first group SPPX_P1 and the second group SPPX_P2 may be arranged in the same row and spaced apart from each other by seven shared image sensing pixels in a row direction. However, arrangements of shared pixels included in the pixel array 110a_2 are not limited to those shown in FIG. 6B, and the first and second shared phase detection pixels SPPX_a1 and SPPX_a2 including phase detection sub pixels may be arranged unlike that shown in FIG. 6B such that the phase detection sub pixels meet the ratio of 1/64.

Referring to FIG. 6C, the pixel array 110a_3 may include a plurality of shared image sensing pixels SIPX_R, SIPX_G, and SIPX_B, third shared phase detection pixels SPPX_a3, and fourth shared phase detection pixels SPPX_a4. The third and fourth shared phase detection pixels SPPX_a3 and SPPX_a4 may be arranged in pairs in the pixel array 110a_3, and thus the number of third shared phase detection pixels SPPX_a3 and the number of fourth shared phase detection pixels SPPX_a4 that are disposed in the pixel array 110a_3 may be the same as each other. Each of the third shared phase detection pixel SPPX_a3 and the fourth shared phase detection pixel SPPX_a4 as a pair may include a plurality of groups SPPX_P1' to SPPX_P4'.

The third shared phase detection pixels SPPX_a3 and the fourth shared phase detection pixels SPPX_a4 each constituting the plurality of groups SPPX_P1' to SPPX_P4' may be arranged in the same row, and three shared image sensing pixels may be arranged between each of the third shared phase detection pixels SPPX_a3 and the fourth shared phase detection pixels SPPX_a4 in a row direction. Therefore, a focus detection operation and a compensation operation may be efficiently performed.

A ratio of the number of the third and fourth shared phase detection pixels SPPX_a3 and SPPX_a4 to the number of a plurality of shared pixels arranged in the pixel array 110a_3 may have a value of 1/32. For example, in the pixel array 110a_1, four of the third shared phase detection pixels SPPX_a3 and four of the fourth shared phase detection pixels SPPX_a4 may be arranged when a plurality of shared pixels are arranged in 16 in a row direction and in 16 in a column direction (16×16), and a total of eight phase detection sub pixels may be arranged.

In an example embodiment, the first group SPPX_P1' and the second group SPPX_P2' may be arranged in the same column and spaced apart from each other by seven shared image sensing pixels in a column direction. The first group SPPX_P1' and the third group SPPX_P3' may be arranged apart from each other by three shared image sensing pixels in a column direction and by three shared image sensing pixels in a row direction. However, the present disclosure is not limited thereto. In another example embodiment, the first group SPPX_P1' and the third group SPPX_P3' may be arranged in the same row, and may be arranged apart from each other by three shared image sensing pixels in a row direction. Thus, in the pixel array 110a_3 according to an example embodiment of the present disclosure, phase detection sub pixels may be arranged to meet the ratio of 1/32 and arrangements of the third shared phase detection pixel SPPX_a3 and the fourth shared phase detection pixel SPPX_a4 including the phase detection sub pixels may be different from those shown in FIG. 6C.

In another example embodiment, a ratio of the number of the third and fourth shared phase detection pixels SPPX_a3 and SPPX_a4 to the number of a plurality of shared pixels arranged in the pixel array 110a_3 may have a value of 1/64. For example, when a plurality of shared pixels are arranged in 16 in a row direction and in 16 in a column direction (16×16), two of the third shared phase detection pixels SPPX_a3 and two of the fourth shared phase detection pixels SPPX_a4 may be arranged in the pixel array 110a_3 such that a total of four phase detection sub pixels may be arranged.

Referring to FIGS. 6A to 6C, the pixel array 110 (of FIG. 2) may include all of the first to fourth shared phase detection pixels SPPX_a1 to SPPX_a4. Here, the pixel array 110 (of FIG. 2) may be arranged such that a ratio of the number of phase detection sub pixels to the number of a plurality of shared pixels is 1/32 or 1/64.

An image sensor including the pixel arrays 110a_1 to 110a_3 according to an example embodiment of the inventive concept includes a plurality of phase detection pixels at an appropriate ratio, so that the image sensor may provide a high-resolution image while providing a phase-difference AF function.

Figure 7:
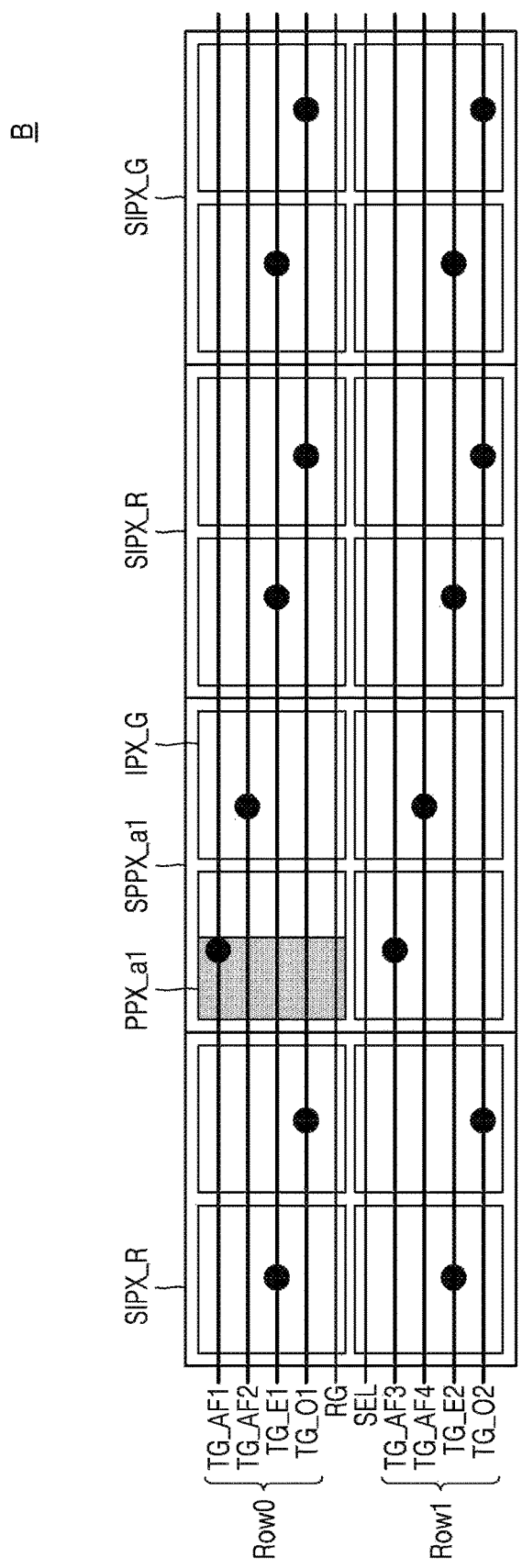
FIG. 7 is a view for explaining a connection between a row driver of FIG. 2 and a pixel array of FIG. 6A.

FIG. 7 is a detailed view for explaining a connection between the row driver 140 of FIG. 2 and the pixel array 110a_1 of FIG. 6A, and shows a portion B of the pixel array 110a_1 and lines connected to the portion B.

Referring to FIG. 7, the pixel array B may be connected to the row driver 140 (of FIG. 2) via transmission control signal lines TG_AF1 to TG_AF4, TG_E1, TG_O1, TG_E2, and TG_O2, a reset signal line RG, and a selection signal line SEL. A plurality of sub pixels included in one shared pixel may be connected to the same selection signal line SEL.

Each of row lines Row0 and Row1 may include the transmission control signal lines TG_E1, TG_O1, TG_E2, and TG_O2 for providing control signals for obtaining image information and the transmission control signal lines TG_AF1 to TG_AF4 for providing control signals for phase difference detection. Thus, each of the row lines Row0 and Row1 may include at least four transmission control signal lines.

Since the first shared phase detection pixel SPPX_a1 needs to output a phase signal different from an image signal, separate transmission control signal lines TG_E1, TG_O1, TG_E2, and TG_O2 may be connected thereto. When the first phase detection sub pixel PPX_a1 outputs a phase signal, a transmission control signal may be transmitted to the first shared phase detection pixel SPPX_a1 so that the image sensing pixels IPX_G included in the first shared phase detection pixel SPPX_a1 do not output image signals.

The description of FIG. 7 may be applied to the second to fourth shared phase detection pixels SPPX_a2 to SPPX_a4 (of FIGS. 4A and 4B) in addition to the first shared phase detection pixel SPPX_a1. However, when the first phase detection sub pixel PPX_a1 outputs a phase signal, a transmission control signal may be transmitted to the second shared phase detection pixel SPPX_a2 so that the second shared phase detection pixel SPPX_a2 may also output a phase signal. Furthermore, when the third phase detection sub pixel PPX_a3 of the third shared phase detection pixel SPPX_a3 outputs a phase signal, a transmission control signal may be transmitted to the fourth shared phase detection pixel SPPX_a4 so that the fourth shared phase detection pixel SPPX_a4 may also output a phase signal.

Figure 8:
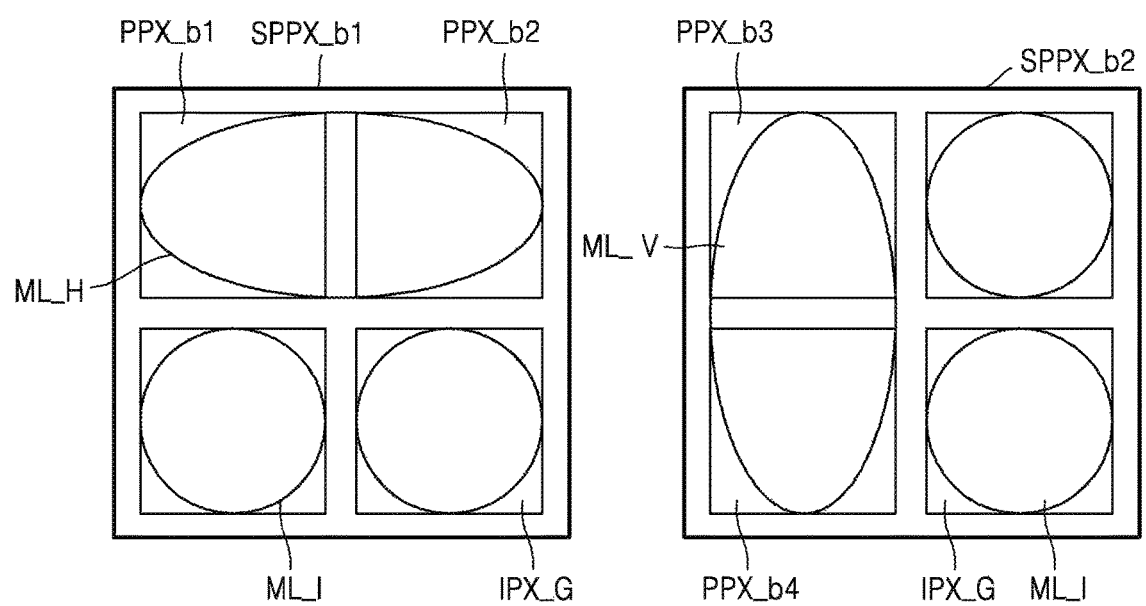
FIG. 8 is a view for explaining an example embodiment of a shared phase detection pixel of FIG. 3.

FIG. 8 is a view for explaining an example embodiment of the shared phase detection pixel SPPX of FIG. 3.

Referring to FIG. 8, the shared phase detection pixel SPPX of FIG. 3 may be a first shared phase detection pixel SPPX_b1 or a second shared phase detection pixel SPPX_b2. The first shared phase detection pixel SPPX_b1 may include two phase detection sub pixels PPX_b1 and PPX_b2 and the second shared phase detection pixel SPPX_b2 may also include two phase detection sub pixels PPX_b3 and PPX_b4. Each of the first shared phase detection pixel SPPX_b1 and the second shared phase detection pixel SPPX_b2 may include the plurality of remaining image sensing pixels IPX_G except for phase detection sub pixels, and each of the plurality of image sensing pixels IPX_G may include a micro lens ML_I.

The first phase detection sub pixel PPX_b1 and the second phase detection sub pixel PPX_b2 may be arranged adjacent to each other in a row direction and the third phase detection sub pixel PPX_b3 and the fourth phase detection sub pixel PPX_b4 may be arranged adjacent to each other in a column direction. The first phase detection sub pixel PPX_b1 and the second phase detection sub pixel PPX_b2 may share a first micro lens ML_H and the third phase detection sub pixel PPX_b3 and the fourth phase detection sub pixel PPX_b4 may share a second micro lens ML_V.

The first phase detection sub pixel PPX_b1 and the second phase detection sub pixel PPX_b2 may output different phase signals depending on a shape and a refractive index of the first micro lens ML_H. Based on the respective phase signals output from the first phase detection sub pixel PPX_b1 and the second phase detection sub pixel PPX_b2, it can be determined whether the lens 1110 (of FIG. 1) is in-focus in a horizontal direction.

The third phase detection sub pixel PPX_b3 and the fourth phase detection sub pixel PPX_b4 may output different phase signals depending on a shape and a refractive index of the second micro lens ML_V. Based on the respective phase signals output from the third phase detection sub pixel PPX_b3 and the fourth phase detection sub pixel PPX_b4, it can be determined whether the lens 1110 (of FIG. 1) is in-focus in a vertical direction.

In an example embodiment, the plurality of image sensing pixels IPX_G may include a green color filter, and each of the first to fourth phase detection sub pixels PPX_b1 to PPX_b4 may also include a green color filter. However, the present disclosure is not limited thereto. In another example embodiment, each of the first to fourth phase detection sub pixels PPX_b1 to PPX_b4 may include a white color filter.

A pixel array including the first shared phase detection pixel SPPX_b1 or the second shared phase detection pixel SPPX_b2 may also be connected to the row driver 140 (FIG. 2) in a manner similar to that shown in FIG. 7.

Figure 9:
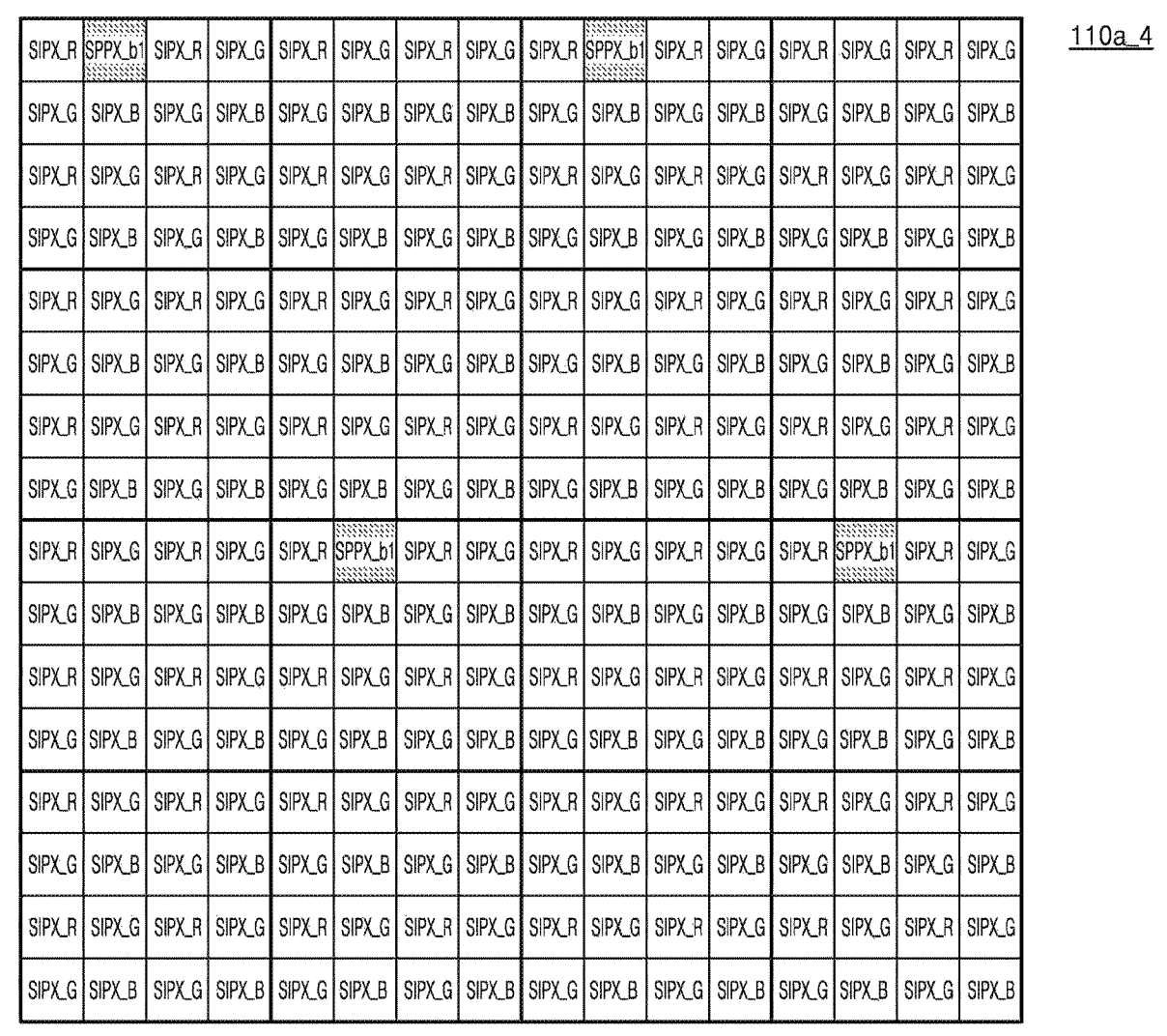

FIG. 9 is a view for explaining arrangements of a plurality of shared pixels included in the pixel array of FIG. 3. FIG. 9 shows a pixel array 110a_4 including the first shared phase detection pixel SPPX_b1 of FIG. 8. In FIG. 9, like reference numerals in FIG. 6A denote like elements, and a duplicate description will be omitted for simplicity.

Referring to FIG. 9, a ratio of the number of a plurality of phase detection sub pixels to the number of a plurality of shared pixels arranged in the pixel array 110a_4 may have a value of 1/32. For example, in the pixel array 110a_4, four of the first shared phase detection pixels SPPX_b1 may be arranged when a plurality of shared pixels are arranged in 16 in a row direction and in 16 in a column direction (16×16), and a total of eight phase detection sub pixels may be arranged. However, the present disclosure is not limited thereto, and a ratio of the number of a plurality of phase detection sub pixels to the number of a plurality of shared pixels arranged in the pixel array 110a_4 may have a value of 1/64. For example, in the pixel array 110a_4, two of the first shared phase detection pixels SPPX_b1 (not shown) may be arranged when a plurality of shared pixels are arranged in 16 in a row direction and in 16 in a column direction (16×16), and a total of four phase detection sub pixels may be arranged.

In the pixel array 110a_4 according to an example embodiment of the present disclosure, phase detection sub pixels may be arranged to meet the ratio of 1/32 or 1/64, and thus an arrangement of the first shared phase detection pixels SPPX_b1 including the phase detection sub pixels may be different from that shown in FIG. 9.

Although only the first shared phase detection pixels SPPX_b1 are shown in FIG. 9, a pixel array of another example embodiment may include a plurality of second shared phase detection pixels SPPX_b2, and arrangements of the second shared phase detection pixels SPPX_b2 may be the same as that of the first shared phase detection pixels SPPX_b1 of FIG. 9. Alternatively, a pixel array of another example embodiment includes all of the plurality of first shared phase detection pixels SPPX_b1 and the plurality of second shared phase detection pixels SPPX_b2, wherein the plurality of first shared phase detection pixels SPPX_b1 and the plurality of second shared phase detection pixels SPPX_b2 may be arranged in the pixel array such that phase detection sub pixels may meet the ratio of 1/32 or 1/64.

Figure 10:
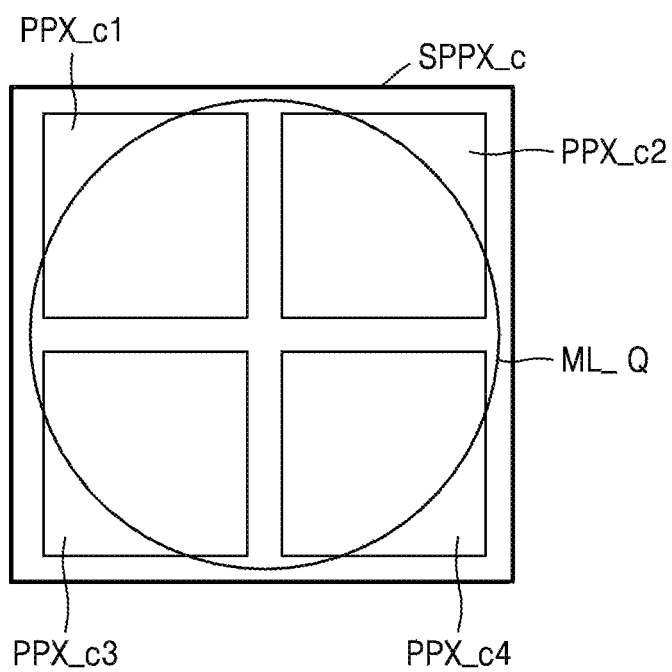
FIG. 10 is a view for explaining an example embodiment of a shared phase detection pixel of FIG. 3.

FIG. 10 is a view for explaining an example embodiment of the shared phase detection pixel SPPX of FIG. 3.

Referring to FIG. 10, the shared phase detection pixel SPPX of FIG. 3 may be a shared phase detection pixel SPPX_c. The shared phase detection pixel SPPX_c may include four phase detection sub pixels PPX_c1 to PPX_c4. The four phase detection sub pixels PPX_c1 to PPX_c4 included in one shared phase detection pixel SPPX_c may share one micro lens ML_Q. Four image sensing sub pixels included in each of the plurality of shared image sensing pixels SIPX0 to SIPX14 (of FIG. 3) may also share one micro lens. However, the present disclosure is not limited thereto and each of a plurality of image sensing sub pixels may include one micro lens.

Since the first to fourth phase detection sub pixels PPX_c1 to PPX_c4 are located in different rows or columns, the first to fourth phase detection sub pixels PPX_c1 to PPX_c4 may output different phase signals depending on a shape and a refractive index of the micro lens ML_Q. Based on the different phase signals, it can be determined whether the lens 1110 (of FIG. 1) is in-focus in a horizontal direction or in a vertical direction.

In an example embodiment, each of the first to fourth phase detection sub pixels PPX_c1 to PPX_c4 may include a green color filter. However, the present disclosure is not limited thereto. In another example embodiment, each of the first to fourth phase detection sub pixels PPX_c1 to PPX_c4 may include a white color filter.

Figure 11:
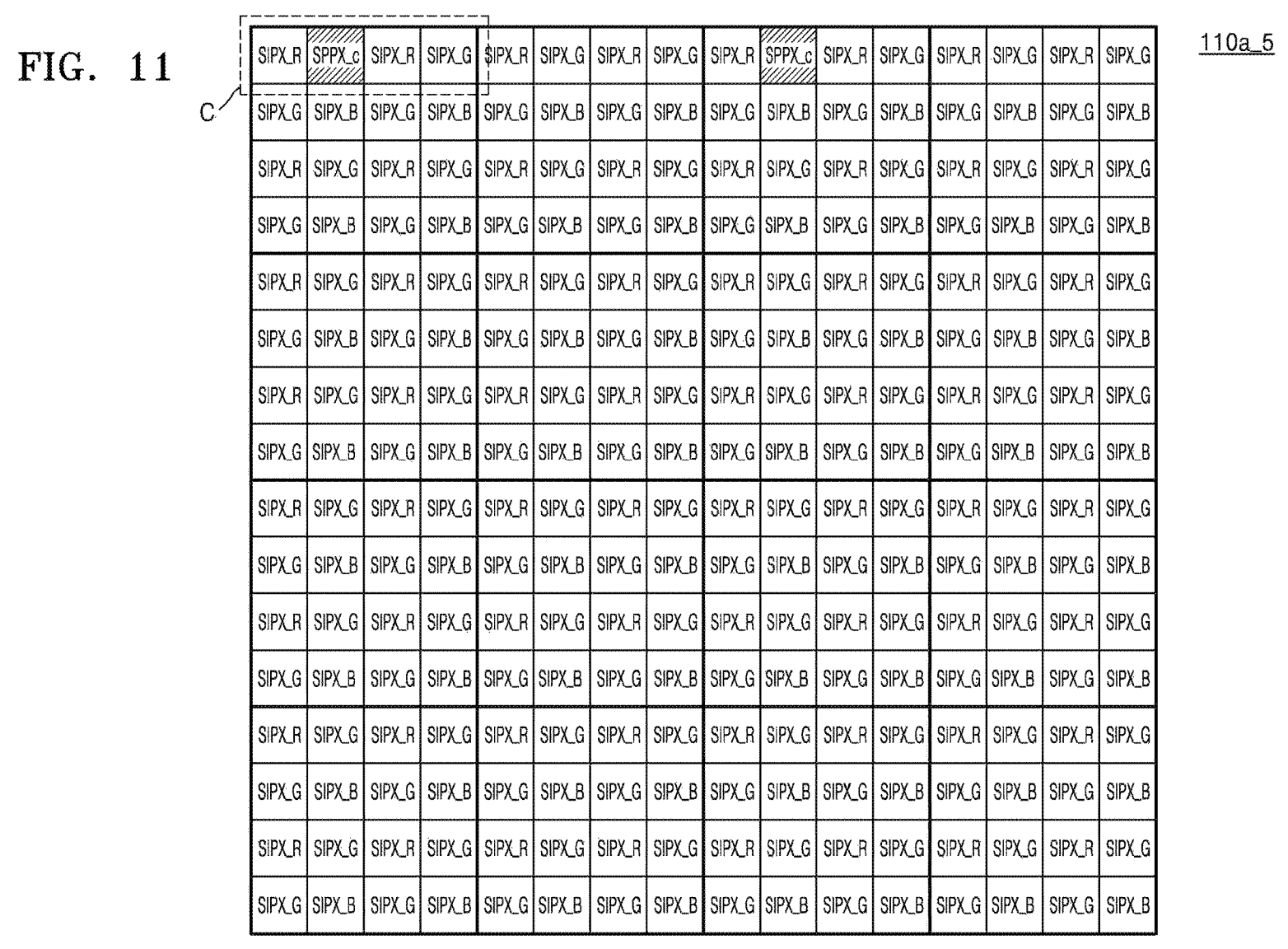

FIG. 11 is a view for explaining arrangements of a plurality of shared pixels included in the pixel array of FIG. 3. FIG. 11 shows a pixel array 110a_5 including the shared phase detection pixel SPPX_c of FIG. 10. In FIG. 11, like reference numerals in FIG. 6A denote like elements, and a duplicate description will be omitted for simplicity.

Referring to FIG. 11, a ratio of the number of a plurality of phase detection sub pixels to the number of a plurality of shared pixels arranged in the pixel array 110a_5 may have a value of 1/32. For example, in the pixel array 110a_5, two shared phase detection pixels SPPX_c may be arranged when a plurality of shared pixels are arranged in 16 in a row direction and in 16 in a column direction (16×16), and a total of eight phase detection sub pixels may be arranged. However, the present disclosure is not limited thereto, and a ratio of the number of a plurality of phase detection sub pixels to the number of a plurality of shared pixels arranged in the pixel array 110a_5 may have a value of 1/64. Therefore, an arrangement of the shared phase detection pixels SPPX_c including the phase detection sub pixels may be different from that of FIG. 11.

Figure 12:
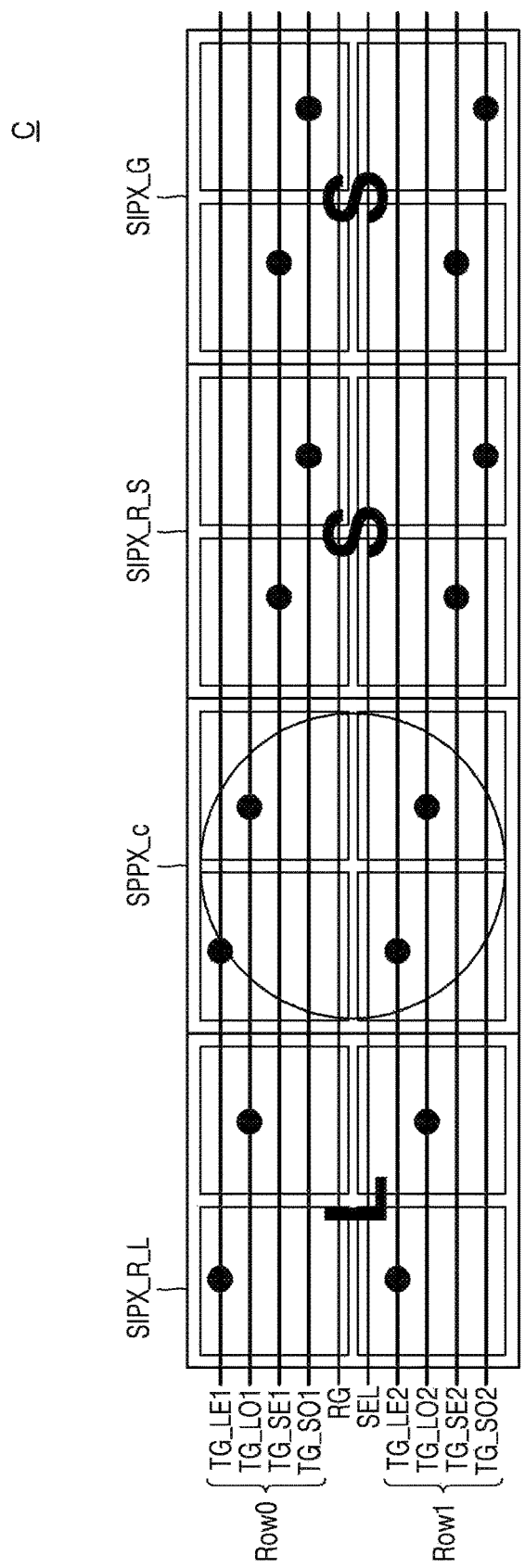
FIG. 12 is a view for explaining a connection between a row driver of FIG. 2 and a pixel array of FIG. 10.

FIG. 12 is a detailed view for explaining a connection between the row driver 140 of FIG. 2 and the pixel array 110a_5 of FIG. 10, and shows a portion C of the pixel array 110a_5 and lines connected to the portion C.

Referring to FIGS. 11 and 12, the pixel array 110a_5 may include a long-time exposure shared pixel L and a short-time exposure shared pixel S. The long-time exposure shared pixel L is a shared pixel for being successively exposed within a constant exposure period to generate a pixel signal, and the short-time exposure shared pixel S is a shared pixel for being intermittently exposed within a constant exposure period to generate a pixel signal. The long-time exposure shared pixel L may include a plurality of photodiodes for long-time exposure and the short-time exposure shared pixel S may include a plurality of photodiodes for short-time exposure. However, FIG. 12 is for explaining an example embodiment of the present disclosure, and the present disclosure is not limited to the arrangement of FIG. 12.

The pixel array C may be connected to the row driver 140 (of FIG. 2) via transmission control signal lines TG_LE1, TG_LO1, TG_SE1, TG_SO1, TG_LE2, TG_LO2, TG_SE2, and TG_SO2, the reset signal line RG, and the selection signal line SEL. Each of the row lines Row0 and Row1 may include four transmission control signal lines, and may further include the transmission control signal lines TG_LE1, TG_LO1, TG_LE2, and TG_LO2 for providing control signals for long-time exposure, and the transmission control signal lines TG_SE1, TG_SO1, TG_SE2, and TG_SO2 for providing control signals for short-time exposure.

A first shared image sensing pixel SIPX_R_L may include four pixels including optical sensing elements for long-time exposure as the long-time exposure shared pixel L, and each of a second shared image sensing pixel SIPX_R_S and a third shared image sensing pixel SIPX_G may include four pixels including optical sensing elements for short-time exposure. The first shared image sensing pixel SIPX_R_L may be connected to the transmission control signal lines TG_LE1, TG_LO1, TG_LE2, and TG_LO2 that provide control signals for long-time exposure, and each of the second shared image sensing pixel SIPX_R_S and the third shared image sensing pixel SIPX_G may be connected to the transmission control signal lines TG_SE1, TG_SO1, TG_SE2, and TG_SO2 that provide control signals for short-time exposure.

Sub pixels included in the shared phase detection pixel SPPX_c are all phase detection sub pixels connected to transmission control signal lines that are connected to shared image sensing pixels, and thus separate transmission control signal lines for Sub pixels included in the shared phase detection pixel SPPX_c may not be connected to the shared phase detection pixel SPPX_c. FIG. 12 shows that the shared phase detection pixel SPPX_c is connected to the transmission control signal lines TG_LE1, TG_LO1, TG_LE2, and TG_LO2 that provide control signals for long-time exposure, but the present disclosure is not limited thereto. The shared phase detection pixel SPPX_c may also be connected to the transmission control signal lines TG_SE1, TG_SO1, TG_SE2, and TG_SO2 that provide control signals for short-time exposure.

An image sensor including the pixel array 110a_5 according to an example embodiment of the present disclosure may be implemented so as to realize a wide dynamic range effect by using a signal processing technique, after capturing images by periodically changing an exposure period in one frame. Therefore, the image sensor including the pixel array 110a_5 may realize a wide dynamic range effect and may provide a phase difference AF function.

Figure 13:
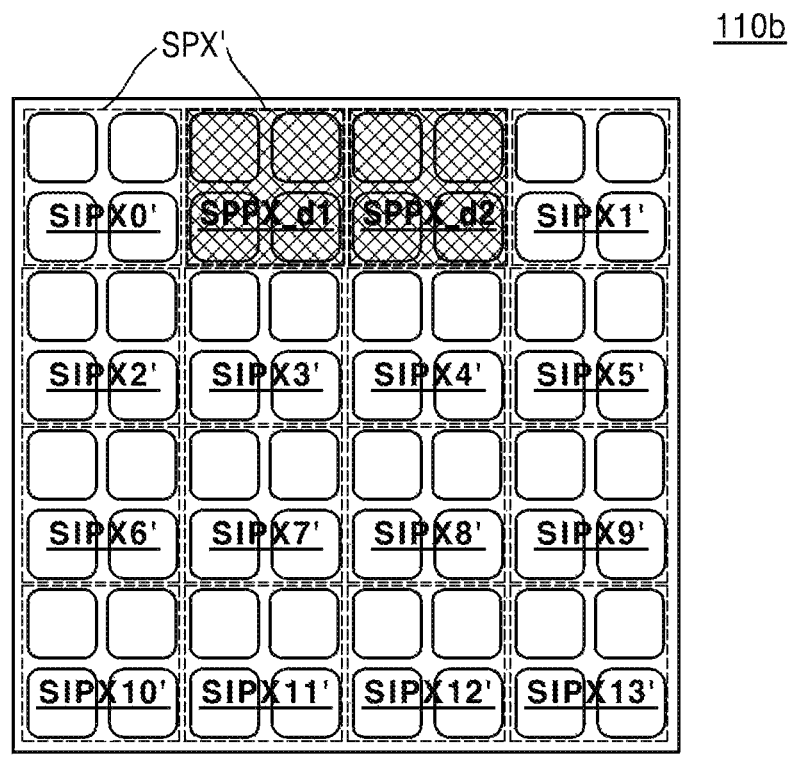
FIG. 13 is a view of an example embodiment of a pixel array of FIG. 2.
Figure 14:
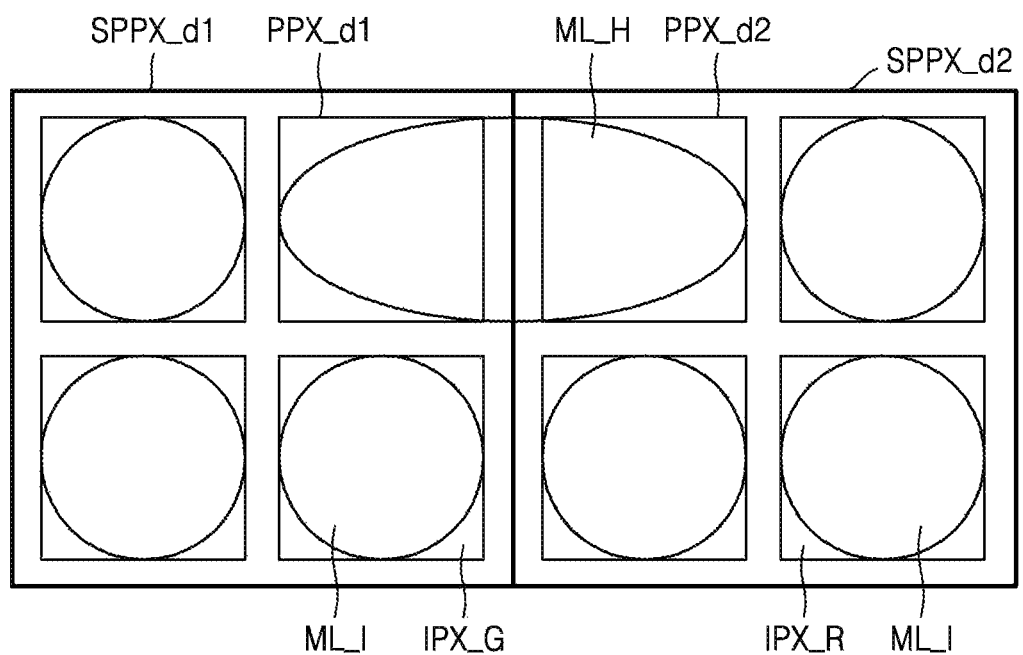
FIG. 14 is a view for explaining an example embodiment of shared phase detection pixels of FIG. 13.

FIG. 13 is a view of an example embodiment of the pixel array 110 of FIG. 2. A pixel array 110b of FIG. 13 shows a portion of the pixel array 110 of FIG. 2. FIG. 14 is a view for explaining an example embodiment of shared phase detection pixels SPPX_d1 and SPPX_d2 of FIG. 13.

Referring to FIGS. 13 and 14, the pixel array 110b may include a plurality of shared pixels SPX' and the plurality of shared pixels SPX' may include a plurality of shared image sensing pixels SIPX0' to SIPX13', a first shared phase detection pixel SPPX_d1, and a second shared phase detection pixel SPPX_d2. The plurality of shared image sensing pixels SIPX0' to SIPX13' may include the plurality of image sensing pixels IPX (of FIG. 2), and each of the first shared phase detection pixel SPPX_d1 and the second shared phase detection pixel SPPX_d2 may include one of phase detection sub pixels PPX_d1 and PPX_d2. Each of the first shared phase detection pixel SPPX_d1 and the second shared phase detection pixel SPPX_d2 may include a plurality of remaining image sensing pixels IPX_G and IPX_R except for phase detection sub pixels.

The first shared phase detection pixel SPPX_d1 and the second shared phase detection pixel SPPX_d2 may be arranged adjacent to each other in a row direction and the first phase detection sub pixel PPX_d1 and the second phase detection sub pixel PPX_d2 may be arranged adjacent to each other in a row direction. However, the present disclosure is not limited thereto, and the first shared phase detection pixel SPPX_d1 and the second shared phase detection pixel SPPX_d2 may be arranged adjacent to each other in a column direction, and the first phase detection sub pixel PPX_d1 and the second phase detection sub pixel PPX_d2 may be arranged adjacent to each other in a column direction.

The first phase detection sub pixel PPX_d1 and the second phase detection sub pixel PPX_d2 may be arranged in pairs so that the same number of first phase detection sub pixels PPX_d1 and second phase detection sub pixels PPX_d2 may be arranged in the pixel array 110b.

The first phase detection sub pixel PPX_d1 and the second phase detection sub pixel PPX_d2 may share one micro lens ML_H. The first phase detection sub pixel PPX_d1 and the second phase detection sub pixel PPX_b2 may output different phase signals depending on a shape and a refractive index of the micro lens ML_H. When the first phase detection sub pixel PPX_d1 and the second phase detection sub pixel PPX_d2 are arranged adjacent to each other in a row direction, it can be determined whether the lens 1110 (of FIG. 1) is in-focus in a horizontal direction, and when the first phase detection sub pixel PPX_d1 and the second phase detection sub pixel PPX_d2 are arranged adjacent to each other in a column direction, it can be determined whether the lens 1110 (of FIG. 1) is in-focus in a vertical direction.

Each of the plurality of shared image sensing pixels SIPX0' to SIPX13' may include a color filter to sense various colors. In an example embodiment, the color filter includes filters that sense red, green, and blue, and each of the shared image sensing pixels SIPX0' to SIPX13' may include pixels in which the same color filter is disposed.

In an example embodiment, one of the first and second shared phase detection pixels SPPX_d1 and SPPX_d2 may include a green color filter. For example, the first shared phase detection pixel SPPX_d1 may include a green color filter and the second shared phase detection pixel SPPX_d2 may include a red color filter. However, the present disclosure is not limited thereto, and each of the first and second phase detection sub pixels PPX_d1 and PPX_d2 included in the first and second shared phase detection pixels SPPX_d1 and SPPX_d2 may include a white color filter.

FIG. 13 respectively shows one of the first and second shared phase detection pixels SPPX_d1 and SPPX_d2, but in the pixel array 110*b*, a ratio of the number of the first and second phase detection sub pixels PPX_d1 and PPX_d2 to the number of a plurality of shared pixels may have a value of ⅟₃₂ or ⅟₆₄. For example, in the pixel array 110*b*, four of the first shared phase detection pixels SPPX_d1 and four of the second phase detection pixels SPPX_d2 or two of the first shared phase detection pixels SPPX_d1 and two of the second phase detection pixels SPPX_d2 may be arranged when the plurality of shared pixels SPX' are arranged in 16 in a row direction and in 16 in a column direction (16×16).

Figure 15A:
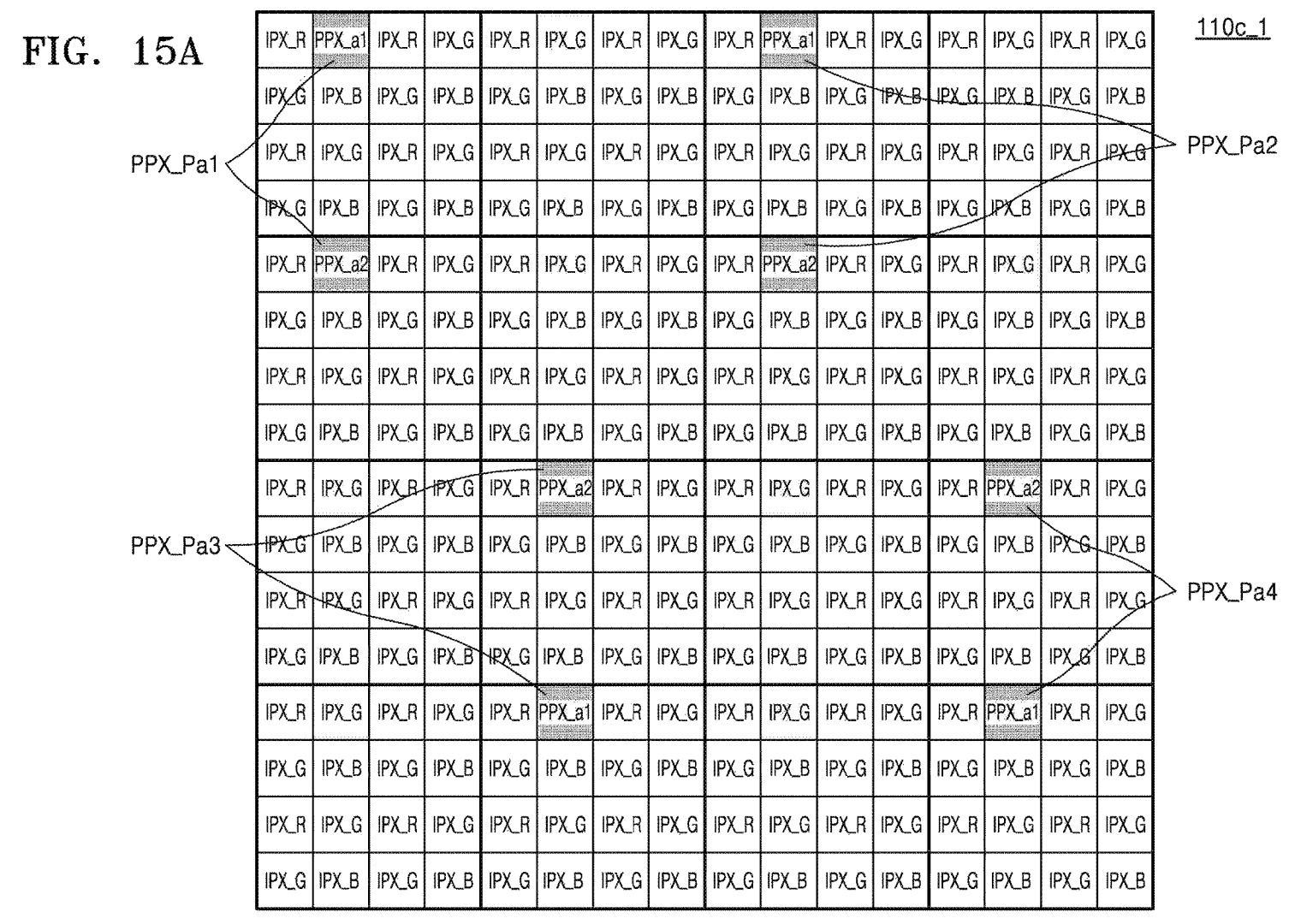
Figure 15B:
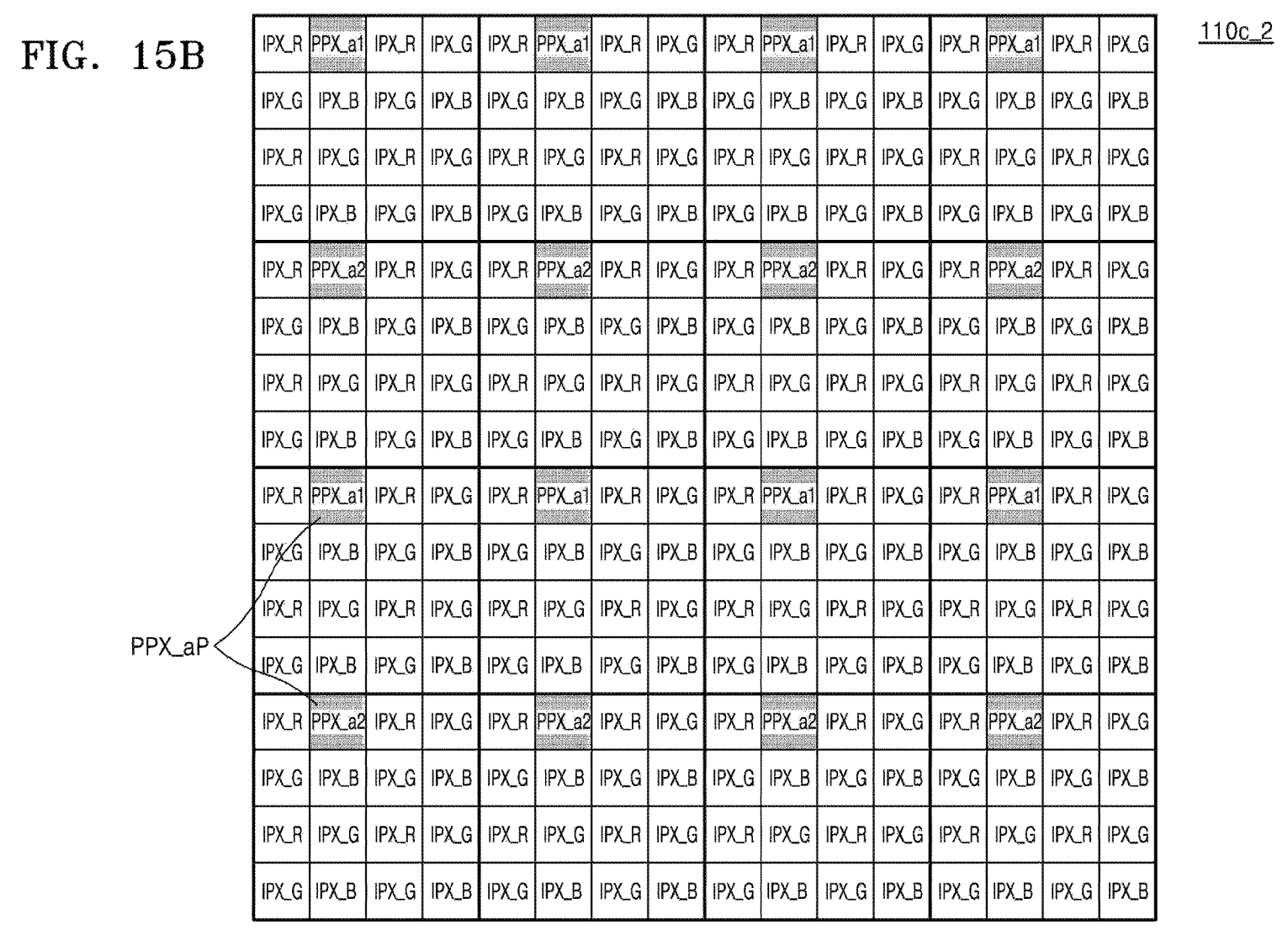
Figure 15C:
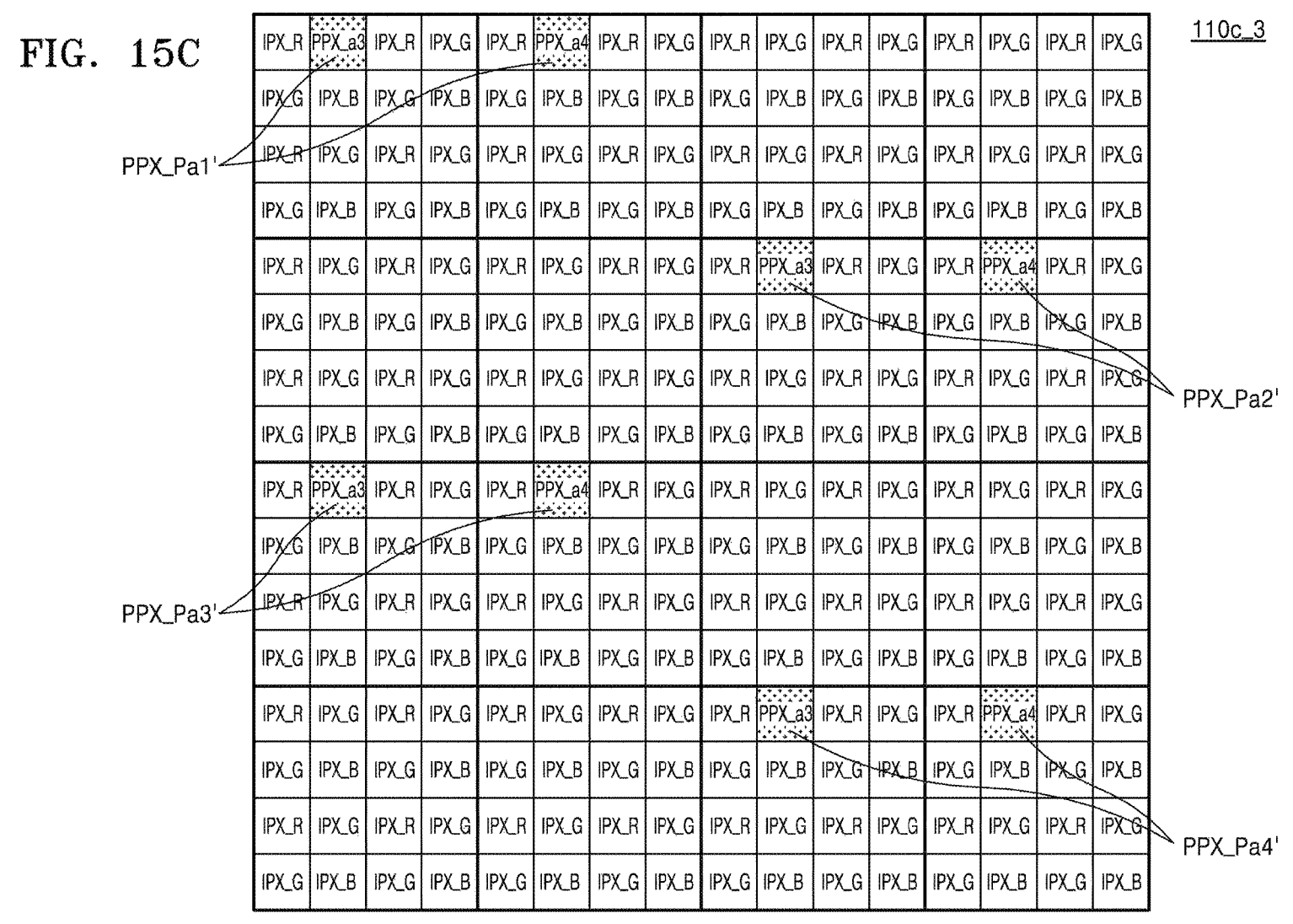

FIGS. 15A to 15C are views for explaining arrangements of a plurality of pixels included in the pixel array 110 of FIG. 2. Compared to the pixel arrays 110*a* and 110*b* of FIGS. 3 and 13, the plurality of pixels in FIGS. 15A to 15C do not constitute one shared pixel, and pixels arranged in the same row may be connected to the same selection signal line. Thus, pixels included in the same row may be simultaneously activated by the selection signal SELSs (of FIG. 2) output by the row driver 140 (of FIG. 2).

Referring to FIG. 15A, a pixel array 110*c*_1 may include a plurality of image sensing pixels IPX_R, IPX_G, and IPX_B, a first phase detection pixel PPX_a1, and a second phase detection pixel PPX_a2. The plurality of image sensing pixels IPX_R, IPX_G, and IPX_B may include a plurality of shared image sensing pixels IPX_R including a red color filter, a plurality of shared image sensing pixels IPX_G including a green color filter, and a plurality of shared image sensing pixels IPX_B including a blue color filter.

The first phase detection pixel PPX_a1 and the second phase detection pixel PPX_a2 may be pixels for phase difference detection AF, and the plurality of image sensing pixels IPX_R, IPX_G, and IPX_B may be general pixels capable of obtaining only image information. Configurations of the first phase detection pixel PPX_a1 and the second phase detection pixel PPX_a2 of FIG. 15A may be the same as those of the first phase detection sub pixel PPX_a1 and the second phase detection sub pixel PPX_a2 of FIG. 4A.

Since the first phase detection pixel PPX_a1 and the second phase detection pixel PPX_a2 are arranged in the pixel array 110*c*_1 as a pair so that the same number of first phase detection pixels PPX_a1 and second phase detection pixels PPX_a2 may be arranged in the pixel array 110*c*_1. The first phase detection pixel PPX_a1 and the second phase detection pixel PPX_a2 as a pair may each constitute a plurality of groups PPX_Pa1 to PPX_Pa4.

The first phase detection pixels PPX_a1 and the second phase detection pixels PPX_a2 each constituting the plurality of groups PPX_Pa1 to PPX_Pa4 may be arranged in the same column, and three image sensing pixels may be arranged between each of the first phase detection pixels PPX_a1 and the second phase detection pixels PPX_a2 in a column direction. Therefore, a focus detection operation and a compensation operation may be efficiently performed.

A ratio of the number of the first phase detection pixel PPX_a1 and the second phase detection pixel PPX_a2 to the number of a plurality of pixels arranged in the pixel array 110*c*_1 may have a value of ⅟₃₂. For example, in the pixel array 110*c*_1, four of the first phase detection pixels PPX_a1 and four of the second phase detection pixels PPX_a2 may be arranged when a plurality of pixels are arranged in 16 in a row direction and in 16 in a column direction (16×16). The first phase detection pixel PPX_a1 and the second phase detection pixel PPX_a2 as a pair may be arranged to be the reverse of that shown in FIG. 15A.

In an example embodiment, the first group PPX_Pa1 and the second group PPX_Pa2 may be arranged in the same row and spaced apart from each other by seven image sensing pixels in a row direction. The first group PPX_Pa1 and the third group PPX_Pa3 may be arranged apart from each other by three image sensing pixels in a column direction and by three image sensing pixels in a row direction. However, the present disclosure is not limited thereto. In another example embodiment, the first group PPX_Pa1 and the second group PPX_Pa2 may be arranged in different rows. Furthermore, the first group PPX_Pa1 and the third group PPX_Pa3 may be arranged in the same column and spaced apart from each other by three image sensing pixels in a column direction. Therefore, arrangements of the first phase detection pixels PPX_a1 and the second phase detection pixels PPX_a2 may be different from those of FIG. 15A.

Referring to FIG. 15B, a phase detection pixel PPX_aP may include the first phase detection pixel PPX_a1 and the second phase detection pixel PPX_a2. A ratio of the number of the first phase detection pixels PPX_a1 and the second phase detection pixels PPX_a2 to the number of a plurality of pixels arranged in a pixel array 110*c*_2 may have a value of ⅟₁₆. For example, in the pixel array 110*c*_2, eight of the first phase detection pixels PPX_a1 and eight of the second phase detection pixels PPX_a2 may be arranged when a plurality of pixels are arranged in 16 in a row direction and in 16 in a column direction (16×16).

However, arrangements of pixels included in the pixel array 110*c*_2 are not limited to those shown in FIG. 15B, and the first and second phase detection pixels PPX_a1 and PPX_a2 including phase detection pixels may be arranged unlike those shown in FIG. 15B such that the phase detection pixels meet the ratio of ⅟₁₆.

Referring to FIG. 15C, a pixel array 110*c*_3 may include the plurality of image sensing pixels IPX_R, IPX_G, and IPX_B, the third phase detection pixel PPX_a3, and the fourth phase detection pixel PPX_a4. Configurations of the third phase detection pixel PPX_a3 and the fourth phase detection pixel PPX_a4 of FIG. 15A may be the same as those of the first phase detection sub pixel PPX_a3 and the second phase detection sub pixel PPX_a4 of FIG. 4B.

Since the third phase detection pixel PPX_a3 and the fourth phase detection pixel PPX_a4 are arranged in the pixel array 110*c*_3 as a pair, the same number of third phase detection pixels PPX_a3 and the fourth phase detection pixels PPX_a4 may be arranged in the pixel array 110*c*_3. Each of the third phase detection pixel PPX_a3 and the fourth phase detection pixel PPX_a4 as a pair may include a plurality of groups PPX_Pa1' to PPX_Pa4'.

The third phase detection pixels PPX_a3 and the fourth phase detection pixels PPX_a4 each constituting the plurality of groups PPX_Pa1' to PPX_Pa4' may be arranged in the same row, and three image sensing pixels may be arranged between each of the third phase detection pixels PPX_a3 and the fourth phase detection pixels PPX_a4 in a row direction. Therefore, a focus detection operation and a compensation operation may be efficiently performed.

A ratio of the number of the third phase detection pixel PPX_a3 and the fourth phase detection pixel PPX_a4 to the number of a plurality of pixels arranged in the pixel array 110c_3 may have a value of 1/32. For example, four of the third phase detection pixels PPX_a3 and four of the fourth phase detection pixels PPX_a4 may be arranged in the pixel array 110c_3 when a plurality of pixels are arranged in 16 in a row direction and in 16 in a column direction (16×16), and a total of eight phase detection pixels may be arranged in the pixel array 110c_3.

In an example embodiment, the first group PPX_Pa1' and the second group PPX_Pa2' may be arranged in the same column and spaced apart from each other by seven image sensing pixels in a column direction. The first group PPX_Pa1' and the third group PPX_Pa3' may be arranged apart from each other by three image sensing pixels in a column direction and by three image sensing pixels in a row direction. However, the present disclosure is not limited thereto. In another example embodiment, the first group PPX_Pa1' and the third group PPX_Pa3' may be arranged in the same row, and may be arranged apart from each other by three image sensing pixels in a row direction only. Therefore, arrangements of the third phase detection pixels PPX_a3 and the fourth phase detection pixels PPX_a4 in the pixel array 110c_3 may be different from those of FIG. 15C.

In another example embodiment, a ratio of the number of the third phase detection pixels PPX_a3 and the fourth phase detection pixels PPX_a4 to the number of a plurality of pixels arranged in the pixel array 110c_3 may have a value of 1/16. For example, when a plurality of pixels are arranged in 16 in a row direction and in 16 in a column direction (16×16), eight of the third phase detection pixels PPX_a3 and eight of the fourth phase detection pixels PPX_a4 may be arranged in the pixel array 110c_3 such that a total of 16 phase detection pixels may be arranged.

Referring to FIGS. 15A to 15C, the pixel array 110 (of FIG. 2) may include all of the first to fourth phase detection pixels PPX_a1 to PPX_a4. A ratio of the number of the first to fourth phase detection pixels PPX_a1 to PPX_a4 to the number of a plurality of pixels arranged in the pixel array 110 may have a value of 1/16 or 1/32.

An image sensor including the pixel arrays 110c_1 to 110c_3 according to an example embodiment of the inventive concept includes a plurality of phase detection pixels at an appropriate ratio, so that the image sensor may provide a high-resolution image while providing a phase-difference AF function.

Figure 16A:
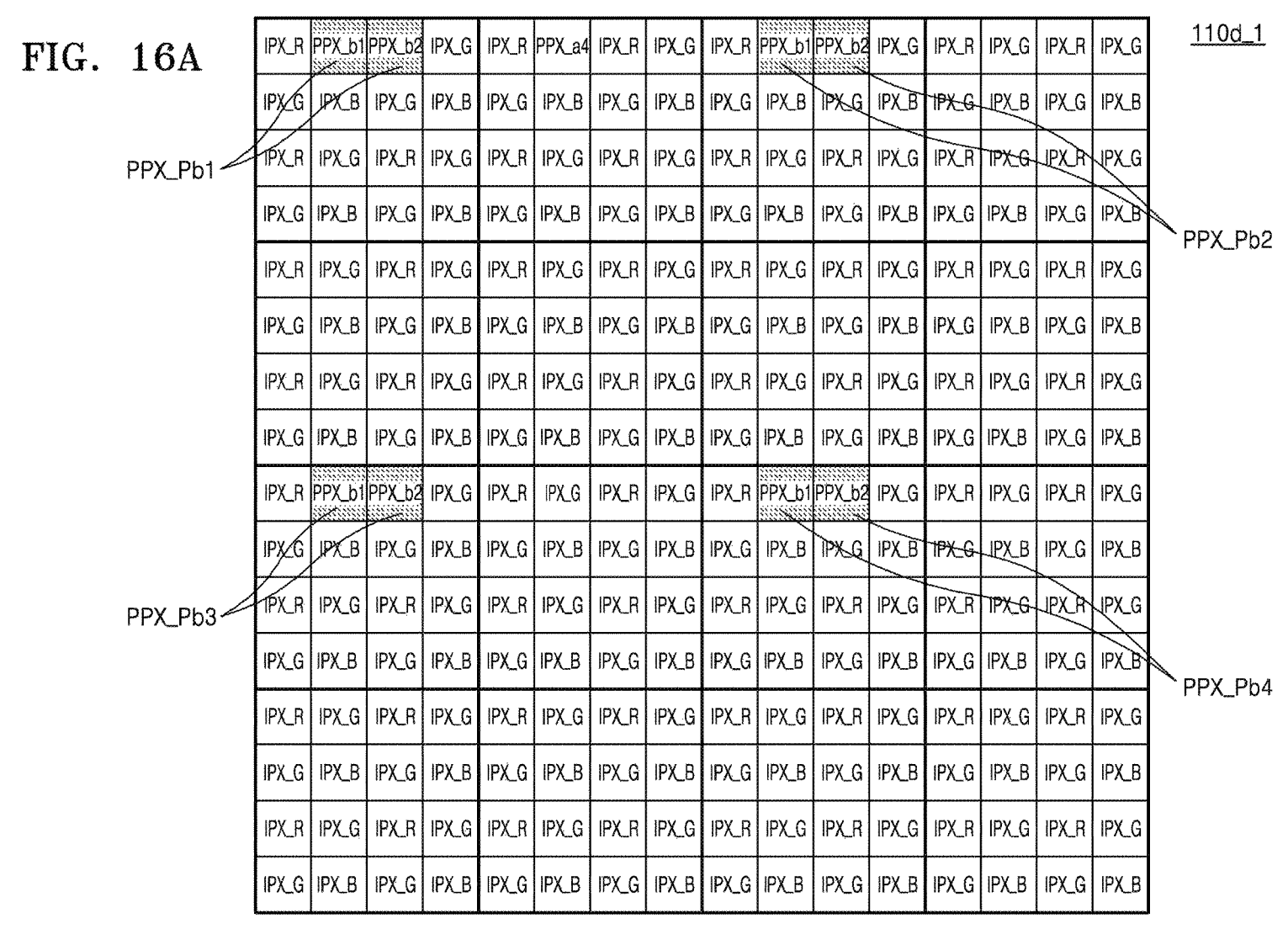
Figure 16B:
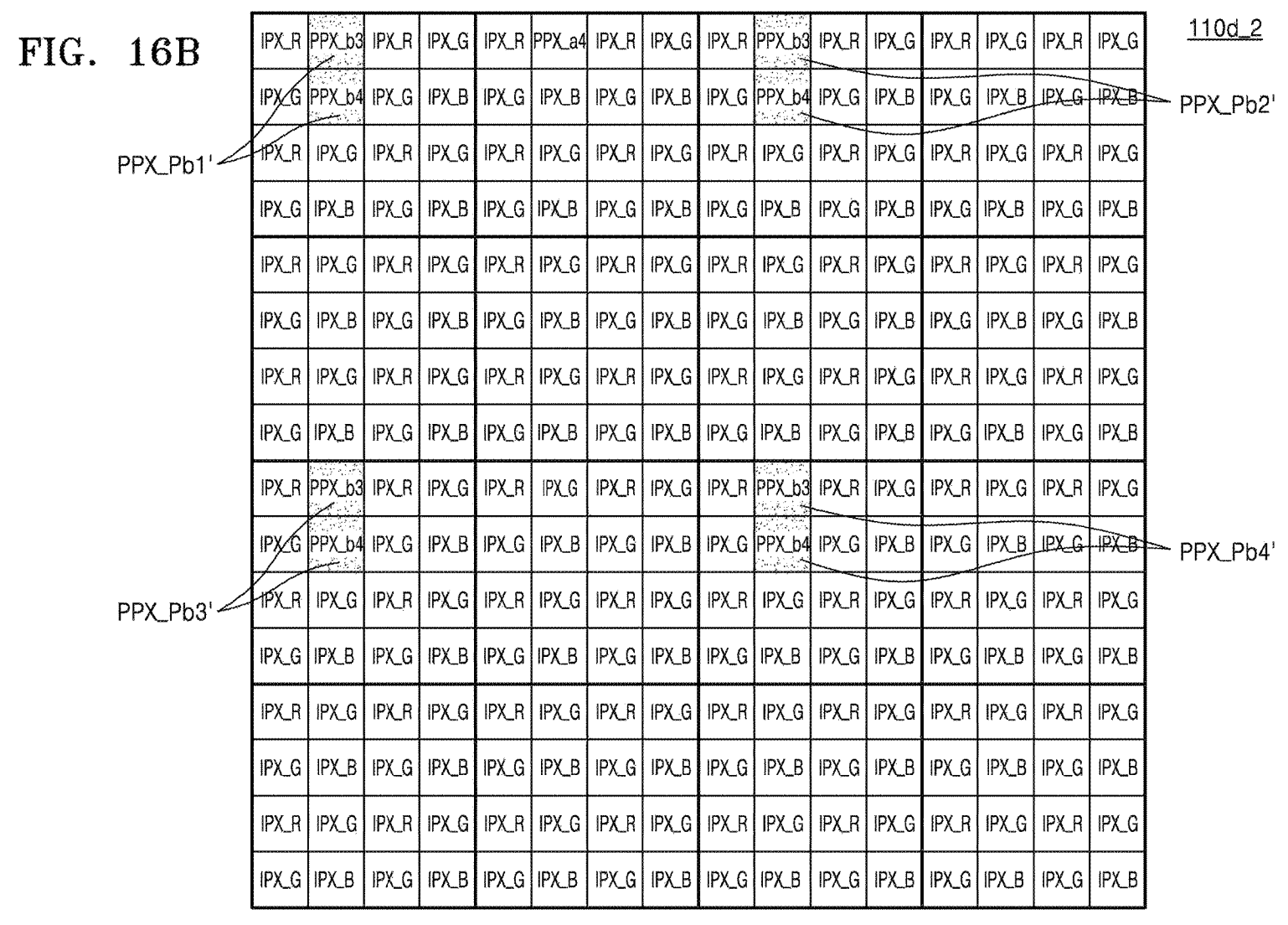

FIGS. 16A and 16B are views for explaining arrangements of a plurality of pixels included in the pixel array 110 of FIG. 2. Compared to the pixel arrays 110a and 110b of FIGS. 3 and 13, the plurality of pixels in FIGS. 16A and 16B do not constitute one shared pixel, and pixels arranged in the same row may be connected to the same selection signal line.

Referring to FIG. 16A, a pixel array 110d_1 may include the plurality of image sensing pixels IPX_R, IPX_G, and IPX_B, a first phase detection pixel PPX_b1, and a second phase detection pixel PPX_b2. Configurations of the first phase detection pixel PPX_b1 and the second phase detection pixel PPX_b2 of FIG. 16A may be the same as those of the first phase detection sub pixel PPX_b1 and the second phase detection sub pixel PPX_b2 of FIG. 8.

The first and second phase detection pixels PPX_b1 and PPX_b2 may be arranged in a pixel array 110d_1 adjacent to each other in a row direction and may be arranged in pairs. Therefore, the number of first phase detection pixels PPX_b1 and the number of second phase detection pixels PPX_b2 arranged in the pixel array 110d_1 may be equal to each other. Each of the first phase detection pixel PPX_b1 and the second phase detection pixel PPX_b2 as a pair may include a plurality of groups PPX_Pb1 to PPX_Pb4.

A ratio of the number of the first phase detection pixel PPX_b1 and the second phase detection pixel PPX_b2 to the number of a plurality of pixels arranged in the pixel array 110d_1 may have a value of 1/32. For example, four of the groups PPX_Pb1 to PPX_Pb4 may be arranged in the pixel array 110d_1 when a plurality of pixels are arranged in 16 in a row direction and in 16 in a column direction (16×16). However, the present disclosure is not limited thereto, and a ratio of the number of the first phase detection pixels PPX_b1 and the second phase detection pixels PPX_b2 to the number of a plurality of pixels arranged in the pixel array 110d_1 may have a value of 1/16.

In an example embodiment, the first group PPX_P1 and the second group PPX_P2 may be arranged in the same row and the first group PPX_P1 and the third group PPX_Pb3 may be arranged in the same column.

In the pixel array 110d_1 according to an example embodiment of the present disclosure, phase detection pixels may be arranged to meet the ratio of 1/32 or 1/16, and thus arrangements of the plurality of groups PPX_Pb1 to PPX_Pb4 may be different from those shown in FIG. 16A.

Referring to FIG. 16B, a pixel array 110d_2 may include the plurality of image sensing pixels IPX_R, IPX_G, and IPX_B, a third phase detection pixel PPX_b3, and a fourth phase detection pixel PPX_b4. Configurations of the third phase detection pixel PPX_b3 and the fourth phase detection pixel PPX_b4 of FIG. 16b may be the same as those of the third phase detection sub pixel PPX_b3 and the fourth phase detection sub pixel PPX_b4 of FIG. 8.

The third phase detection pixel PPX_b3 and the fourth phase detection pixel PPX_b4 may be arranged in the pixel array 110d_2 adjacent to each other in a column direction and may be arranged in pairs. Therefore, the number of third phase detection pixels PPX_b3 and the number of fourth phase detection pixels PPX_b4 arranged in the pixel array 110d_2 may be equal to each other. Each of the third phase detection pixel PPX_b3 and the fourth phase detection pixel PPX_a4 as a pair may include a plurality of groups PPX_Pb1' to PPX_Pb4'.

A ratio of the number of the third phase detection pixels PPX_b3 and the fourth phase detection pixels PPX_b4 to the number of a plurality of pixels arranged in the pixel array 110d_2 may have a value of 1/32. For example, four of the groups PPX_Pb1' to PPX_Pb4' may be arranged in the pixel array 110d_2 when a plurality of pixels are arranged in 16 in a row direction and in 16 in a column direction (16×16). However, the present disclosure is not limited thereto, and a ratio of the number of the third phase detection pixels PPX_b3 and the fourth phase detection pixels PPX_b4 to the number of a plurality of pixels arranged in the pixel array 110d_2 may have a value of 1/16.

In an example embodiment, the first group PPX_Pb1' and the second group PPX_Pb2' may be arranged in the same row and the first group PPX_Pb1' and the third group PPX_Pb3' may be arranged in the same column. In the pixel array 110d_2 according to an example embodiment of the present disclosure, phase detection pixels may be arranged to meet the ratio of $\frac{1}{32}$ or $\frac{1}{16}$, and thus arrangements of the plurality of groups PPX_Pb1' to PPX_Pb4' may be different from those shown in FIG. 16B.

Referring to FIGS. 16A and 16B, the pixel array 110 (of FIG. 2) may include all of the first to fourth phase detection pixels PPX_b1 to PPX_b4. A ratio of the number of the first to fourth phase detection pixels PPX_b1 to PPX_b4 to the number of a plurality of pixels arranged in the pixel array 110 may have a value of $\frac{1}{16}$ or $\frac{1}{32}$.

An image sensor including the pixel arrays 110d_1 and 110d_2 according to an example embodiment of the inventive concept includes a plurality of phase detection pixels at an appropriate ratio, so that the image sensor may provide a high-resolution image while providing a phase-difference AF function.

While the inventive concept has been particularly shown and described with reference to example embodiments thereof, it will be understood that various changes in form and details may be made therein without departing from the spirit and scope of the following claims.

What is claimed is:

1. An image sensor including a pixel array which provides a plurality of pixels arranged in rows and columns, wherein the plurality of pixels comprises:
   a plurality of image sensing pixels each including a plurality of image sensing sub pixels that include the same color filter; and
   a plurality of phase detection pixels each including at least one phase detection sub pixel configured to generate a phase signal for calculating a phase difference between images,
   wherein the plurality of image sensing sub pixels included in the same image sensing pixel are connected to one selection signal line and receive the same selection signal, and
   wherein each phase detection pixel includes an image sensing sub pixel, and the at least one phase detection sub pixel and the image sensing sub pixel included in the same phase detection pixel are connected to the same selection signal line and share the same color filter.

2. The image sensor of claim 1, wherein
   a ratio of the number of phase detection sub pixels arranged in the pixel array to the number of the plurality of pixels arranged in the pixel array is $\frac{1}{32}$ or $\frac{1}{64}$.

3. The image sensor of claim 1, wherein
   each of the plurality of phase detection pixels includes one phase detection sub pixel including an optical sensing element and a light-shielding layer, wherein
   the light-shielding layer is configured to shield some of light incident on the optical sensing element.

4. The image sensor of claim 3, wherein
   the plurality of phase detection pixels includes a first phase detection pixel and a second phase detection pixel, wherein
   the first phase detection pixel and the second phase detection pixel are arranged in the same row or column, and
   three image sensing pixels are arranged between the first phase detection pixel and the second phase detection pixel.

5. The image sensor of claim 1, wherein
   each of the plurality of phase detection pixels includes two phase detection sub pixels arranged adjacent to each other in a row direction, wherein
   the two phase detection sub pixels included in the same phase detection pixel include the same color filter and one micro lens formed on the same color filter.

6. The image sensor of claim 1, wherein
   each of the plurality of phase detection pixels includes two phase detection sub pixels arranged adjacent to each other in a column direction, wherein
   the two phase detection sub pixels included in the same phase detection pixel include the same color filter and one micro lens formed on the same color filter.

7. The image sensor of claim 1, wherein
   the plurality of phase detection pixels further include a green color filter or a blue color filter.

8. The image sensor of claim 1, wherein
   the plurality of phase detection pixels further include a white color filter.

9. An image sensor including a pixel array providing a plurality of pixels arranged in a first direction and a second direction, wherein
   the plurality of pixels comprise:
   a plurality of image sensing pixels each configured to generate an image signal; and
   a first phase detection pixel and a second phase detection pixel configured to generate different phase signals for calculating phase differences between images,
   wherein a ratio of the number of the first phase detection pixels and the number of the second phase detection pixels to the number of the plurality of pixels arranged in the pixel array has a value of $\frac{1}{16}$ or $\frac{1}{32}$,
   wherein each of the first phase detection pixel and the second phase detection pixel includes an optical sensing element and a light-shielding layer formed on the optical sensing element, and
   wherein the first phase detection pixel and the second phase detection pixel are arranged in the first direction and three image sensing pixels are arranged between the first phase detection pixel and the second phase detection pixel in the first direction.

10. The image sensor of claim 9, wherein
    the first direction is a column direction.

11. The image sensor of claim 9, wherein
    the first direction is a row direction.

12. The image sensor of claim 9, wherein
    the first phase detection pixel and the second phase detection pixel include one of a green color filter, a blue color filter, and a white color filter.

13. An image sensor comprising:
    a pixel array including a plurality of phase detection pixels and a plurality of image sensing pixels; and
    a row driver configured to generate signals for controlling the pixel array,
    wherein each of the plurality of phase detection pixels includes at least one phase detection sub pixel,
    wherein each of the plurality of image sensing pixels includes a plurality of image sensing sub pixels connected to the row driver through one selection signal line and receive the same selection signal,
    wherein each of the plurality of phase detection pixels includes four phase detection sub pixels sharing one micro lens,
    wherein the plurality of image sensing pixels includes a first image sensing pixel and a second image sensing pixel, and wherein the first image sensing pixel, the second image sensing pixel, and a portion of the plurality of phase detection pixels are arranged in the same row.

14. The image sensor of claim 13, wherein
the row driver is configured to transmit a first transmission control signal to a first image sensing pixel such that the first optical sensing element is exposed for a first time period, and to transmit a second transmission control signal to a second image sensing pixel such that the second optical sensing element is exposed for a second time period different from the first time period.

* * * * *